(12) United States Patent
Nguyen

(10) Patent No.: US 12,324,121 B2
(45) Date of Patent: Jun. 3, 2025

(54) OUTDOOR ELECTRONICS ENCLOSURE WITH MODULAR STRUCTURE

(71) Applicant: Outdoor Wireless Networks LLC, Claremont, NC (US)

(72) Inventor: Tri Nguyen, Richardson, TX (US)

(73) Assignee: Outdoor Wireless Networks LLC, Richardson, TX (US)

(*) Notice: Subject to any disclaimer, the term of this patent is extended or adjusted under 35 U.S.C. 154(b) by 166 days.

(21) Appl. No.: 18/347,878

(22) Filed: Jul. 6, 2023

(65) Prior Publication Data
US 2024/0008642 A1 Jan. 11, 2024

Related U.S. Application Data

(60) Provisional application No. 63/359,992, filed on Jul. 11, 2022.

(51) Int. Cl.
| | |
|---|---|
| H05K 7/18 | (2006.01) |
| H05K 5/00 | (2006.01) |
| H05K 5/02 | (2006.01) |
| H05K 7/14 | (2006.01) |
| H04Q 1/02 | (2006.01) |

(52) U.S. Cl.
CPC .............. *H05K 7/186* (2013.01); *H05K 5/00* (2013.01); *H04Q 1/025* (2013.01); *H05K 5/02* (2013.01)

(58) Field of Classification Search
CPC . H05K 5/00; H05K 5/02; A47B 81/00; A47B 47/00; A47B 47/03; H04Q 1/025
See application file for complete search history.

(56) References Cited

U.S. PATENT DOCUMENTS

| | | | | |
|---|---|---|---|---|
| 6,145,683 | A * | 11/2000 | Taniguchi | H05K 5/30 220/4.03 |
| 6,892,497 | B2 * | 5/2005 | Moon | E04B 1/34321 52/270 |
| 7,113,762 | B1 * | 9/2006 | Hertz | H05K 7/1488 361/600 |
| 8,430,254 | B2 * | 4/2013 | Kunis | A47B 96/00 312/258 |
| 8,680,407 | B1 * | 3/2014 | Chan | H02G 3/086 174/561 |
| 11,083,093 | B2 | 8/2021 | Mann et al. | |
| 2007/0206362 | A1 * | 9/2007 | Fernandez | H05K 7/186 361/730 |
| 2009/0185333 | A1 * | 7/2009 | Coomer | H02B 13/025 361/622 |
| 2017/0150636 | A1 * | 5/2017 | Segroves | H05K 7/14 |
| 2017/0280580 | A1 * | 9/2017 | Nguyen | H05K 7/186 |
| 2021/0410318 | A1 * | 12/2021 | Ruiz | H05K 7/1418 |
| 2022/0104384 | A1 * | 3/2022 | Chen | H04Q 1/14 |
| 2022/0248556 | A1 * | 8/2022 | Chase | H04Q 1/025 |

* cited by examiner

*Primary Examiner* — Kimberley S Wright
(74) *Attorney, Agent, or Firm* — Myers Bigel, P.A.

(57) ABSTRACT

An electronics enclosure includes: a pair of floor panels that engage to form a floor; a pair of ceiling panels that engage to form a ceiling; a rear wall; four L-shaped supports that are fixed together to form a rectangular framework, the framework being fixed to the rear wall, the floor panels, and the ceiling panels; a pair of side wall panels attached to the framework; and a pair of door panels attached to the side wall panels.

20 Claims, 21 Drawing Sheets

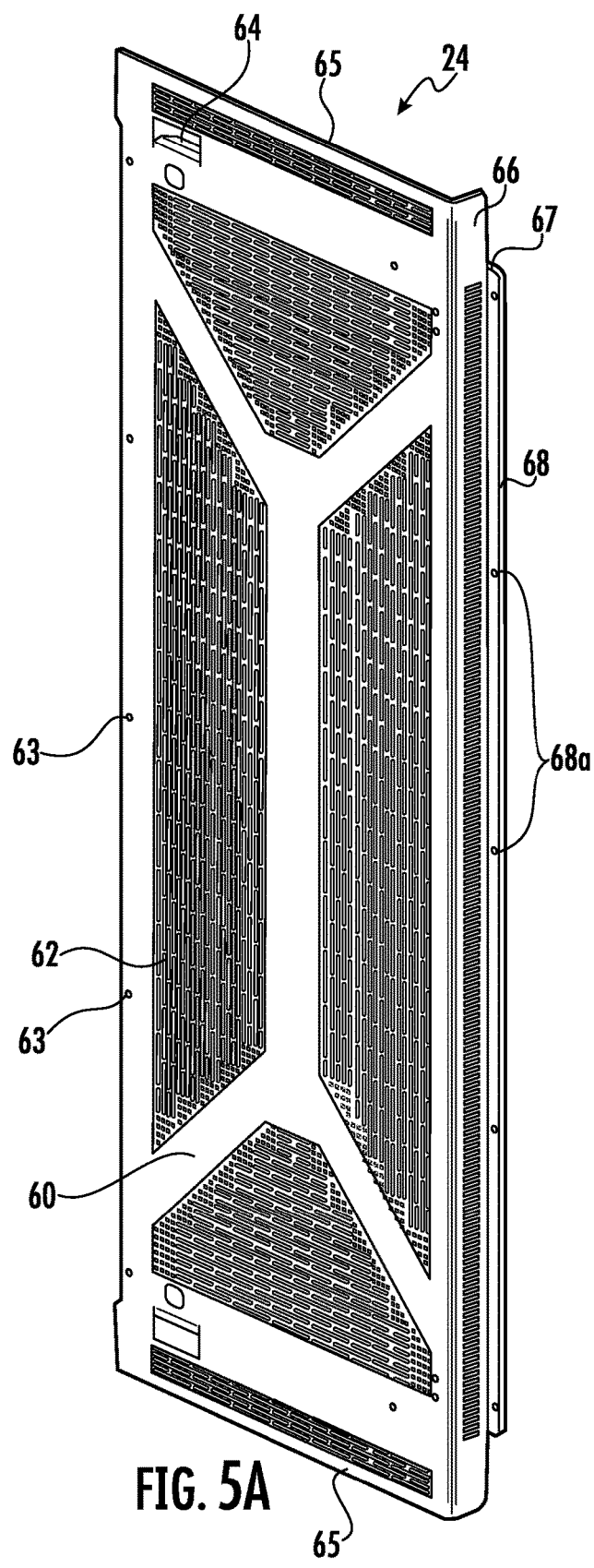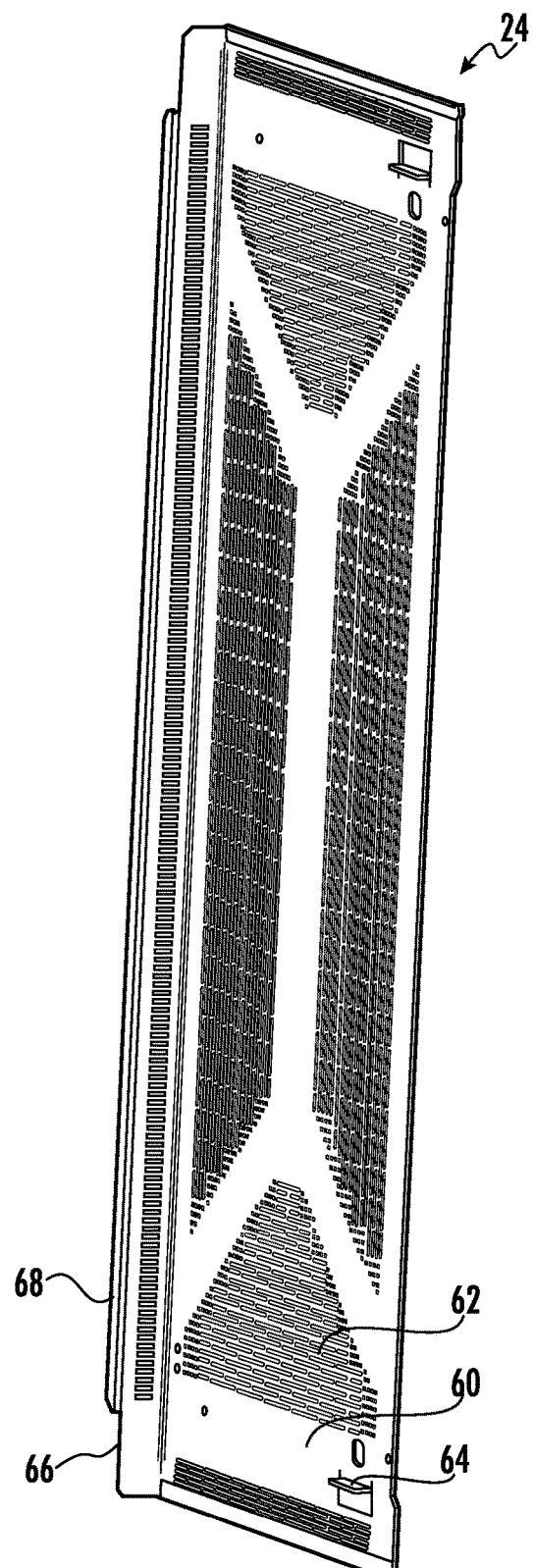
FIG. 5A
FIG. 5B

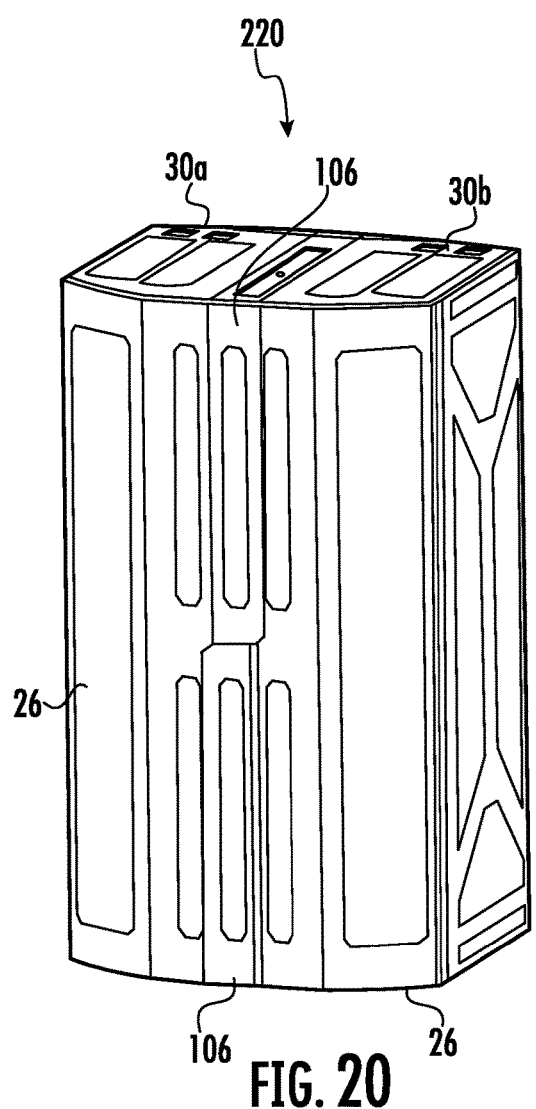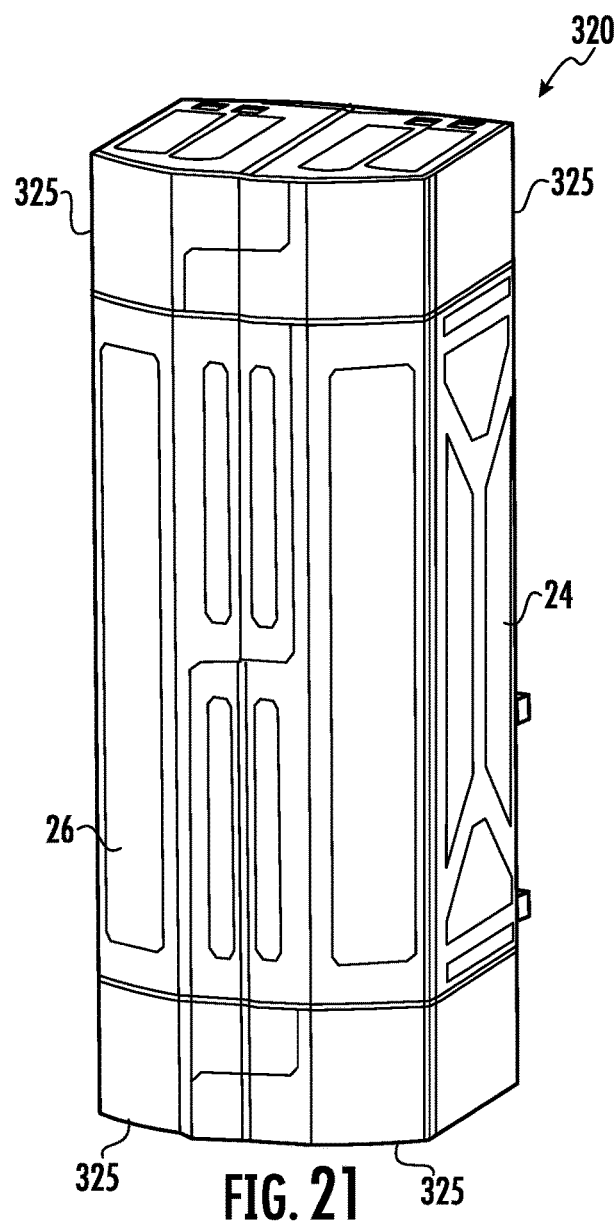

OUTDOOR ELECTRONICS ENCLOSURE WITH MODULAR STRUCTURE

RELATED APPLICATION

The present application claims priority from and the benefit of U.S. Provisional Patent Application No. 63/359,992, filed Jul. 11, 2022, the disclosure of which is hereby incorporated herein by reference in full.

FIELD OF THE INVENTION

The present invention relates generally to cabinets, and more specifically to electronics cabinets.

BACKGROUND OF THE INVENTION

Outdoor electronics cabinets have become popular in recent years. They can protect a wide range of electronic equipment including radios, multicarrier power amplifiers (MCPA), power supplies, batteries, and wireless cell site backhaul equipment. These cabinets can protect base station equipment from environmental conditions while minimizing operating expenses and energy consumption.

Electronics cabinets are typically offered in a limited number of configurations and sizes. It may be desirable to provide cabinets in more varied configurations. One approach is discussed in U.S. Pat. No. 11,083,093 to Mann et al., which describes a modular approach to cabinet construction, and in particular the capacity to expand or modify the size of the cabinet using a limited number of different parts. It may be desirable to provide other modular approaches, particularly those that may provide increased flexibility in the number of cabinet sizes available.

SUMMARY OF THE INVENTION

As a first aspect, embodiments of the invention are directed to an electronics enclosure. The electronics enclosure comprises; a pair of floor panels that engage to form a floor; a pair of ceiling panels that engage to form a ceiling; a rear wall; four L-shaped supports that are fixed together to form a rectangular framework, the framework being fixed to the rear wall, the floor panels, and the ceiling panels; a pair of side wall panels attached to the framework; and a pair of door panels attached to the side wall panels.

As a second aspect, embodiments of the invention are directed to an electronics enclosure comprising; a pair of floor panels that engage to form a floor; a pair of ceiling panels that engage to form a ceiling; a rear wall; first, second, third and fourth L-shaped supports that are fixed together to form a rectangular framework, the framework being fixed to the rear wall, the floor panels, and the ceiling panels, the first and second L-shaped supports being identical, and the third and fourth L-shaped supports being identical; a pair of identical side wall panels pivotally attached to the framework; and a pair of identical door panels pivotally attached to the side wall panels.

As a third aspect, embodiments of the invention are directed to an electronics enclosure comprising; a pair of floor panels that engage to form a floor; a pair of ceiling panels that engage to form a ceiling; a rear wall; four L-shaped supports that are fixed together to form a rectangular framework, the framework being fixed to the rear wall, the floor panels, and the ceiling panels; a pair of side wall panels attached to the framework; and a pair of door panels attached to the side wall panels. A first of the floor panels includes a first main section and an offset overlay panel, and the second of the floor panels includes a second main section. The overlay panel overlies the second main section, such that the floor panels can accommodate enclosures of different widths.

BRIEF DESCRIPTION OF THE FIGURES

FIGS. 5A and 5B are front and rear perspective views of a side wall panel of the modular enclosure of FIG. 1A.

FIG. 20 is a perspective view of a modular enclosure according to alternative embodiments of the invention.

FIG. 21 is a perspective view of a modular enclosure according to further embodiments of the invention.

DETAILED DESCRIPTION OF THE EMBODIMENTS

Figure 1A:
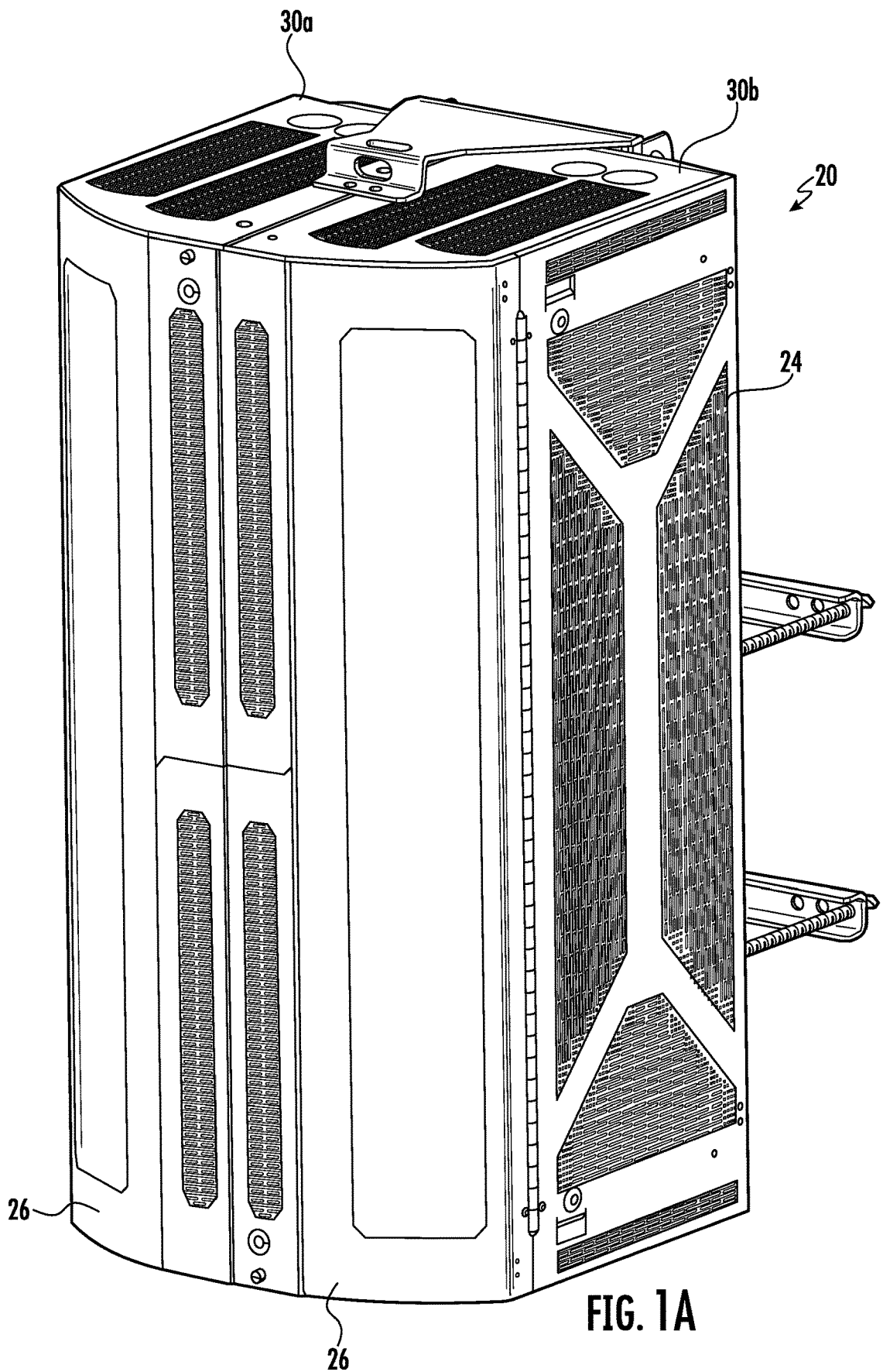
FIG. 1A is a front perspective view of a modular enclosure according to embodiments of the invention.

The present invention will now be described more fully hereinafter, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. Thicknesses and dimensions of some components may be exaggerated for clarity.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

As used herein, the term "forward" and derivatives thereof refer to the general direction vial carriers and vials travel as they move from station to station; this term is intended to be synonymous with the term "downstream", which is often used in manufacturing environments to indicate that certain material being acted upon is farther along in the manufacturing process than other material. Conversely, the terms "rearward" and "upstream" and derivatives thereof refer to the directions opposite, respectively, the forward and downstream directions.

Well-known functions or constructions may not be described in detail for brevity and/or clarity.

Figure 1B:
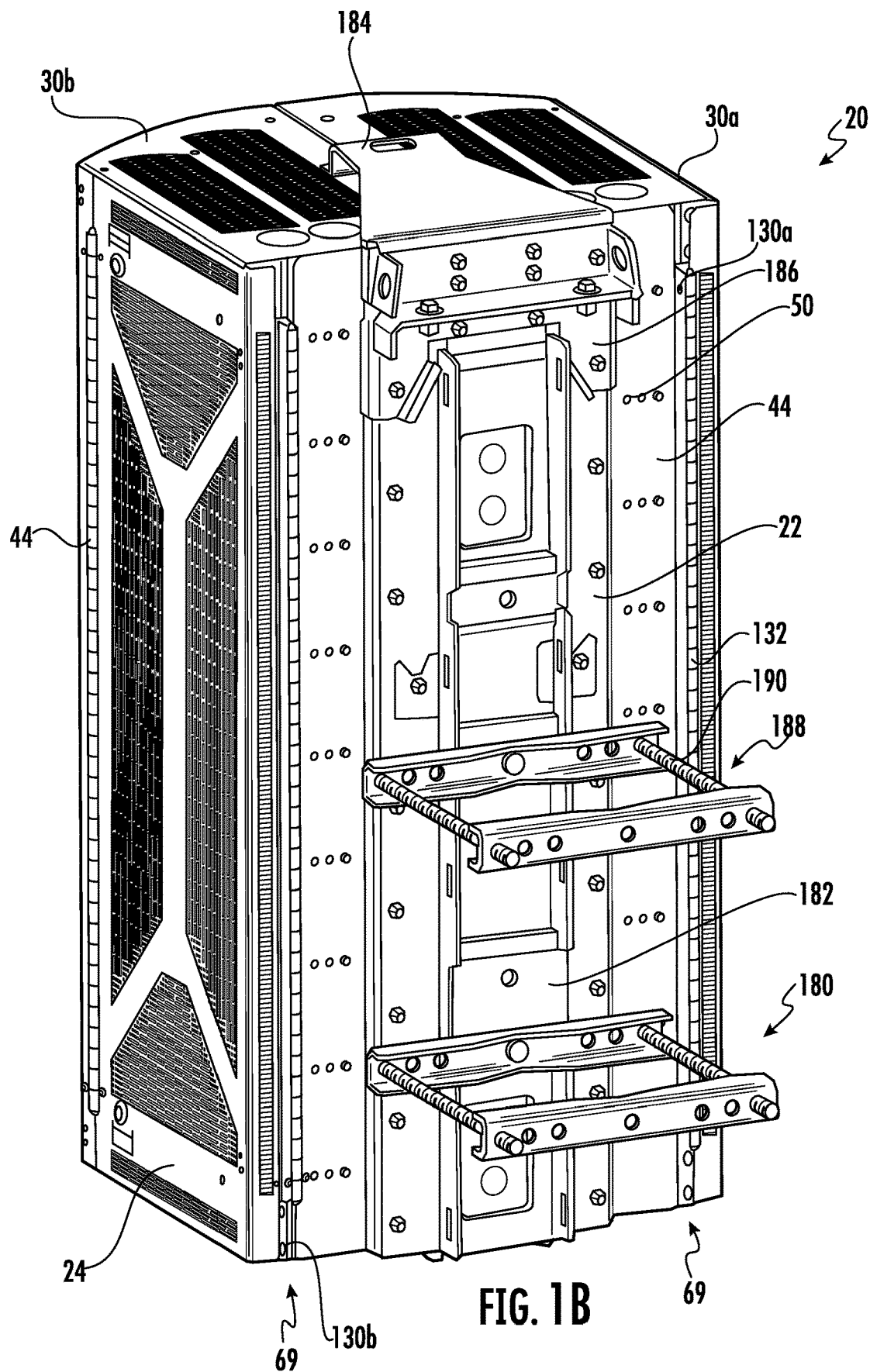
FIG. 1B is a rear perspective view of the modular enclosure of FIG. 1A.
Figure 2:
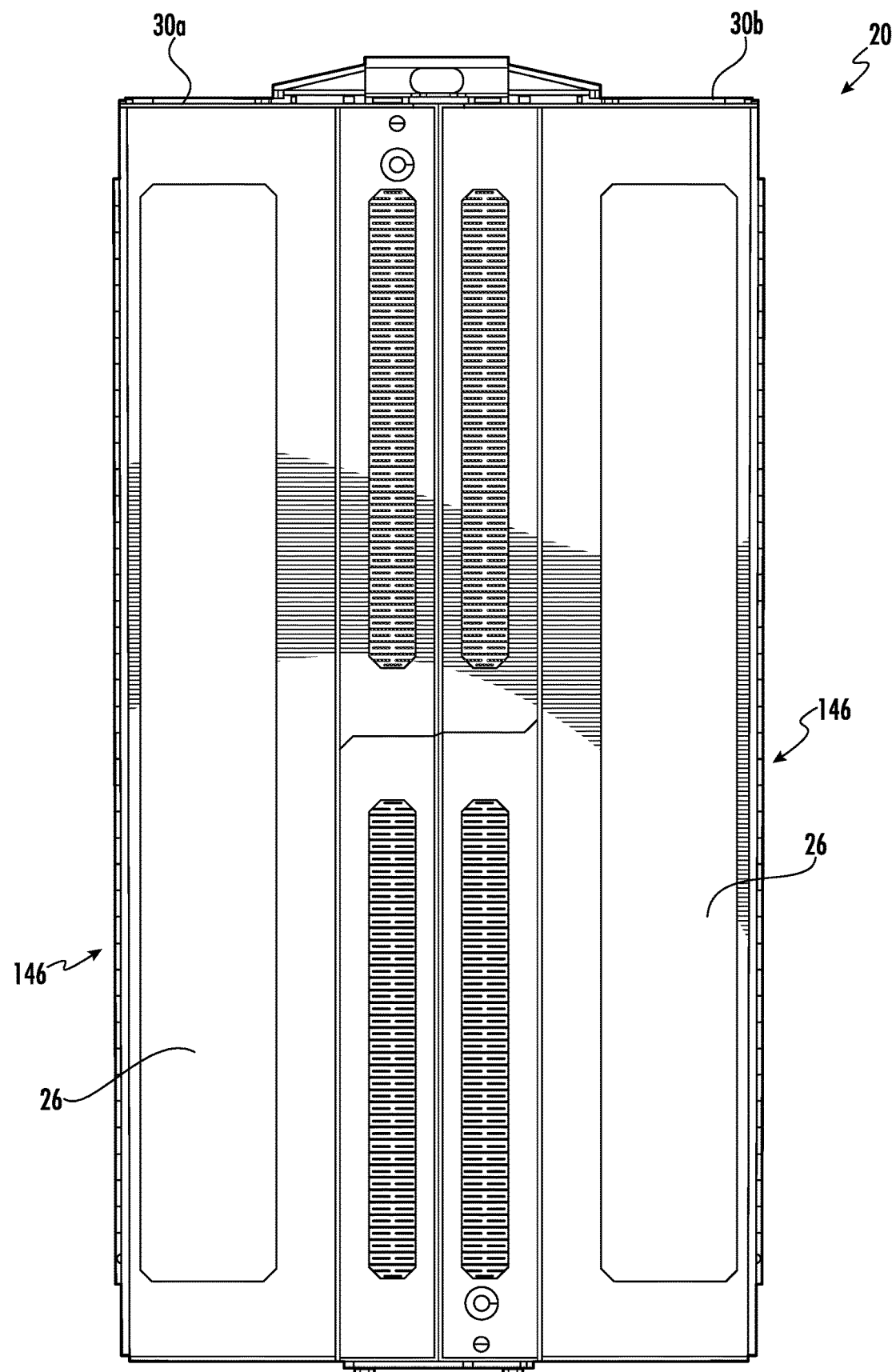
FIG. 2 is a front view of the modular enclosure of FIG. 1A.
Figure 3:
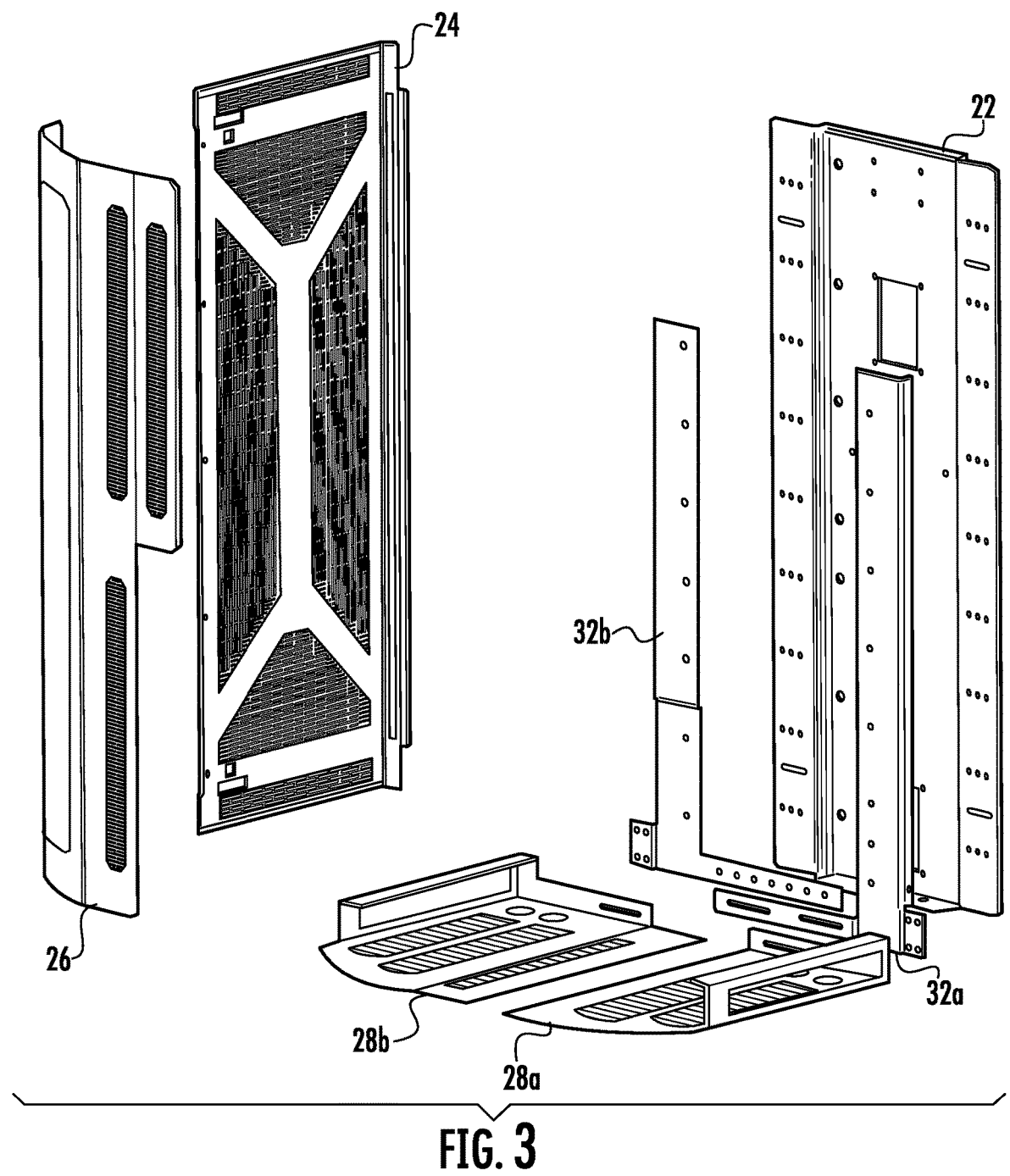
FIG. 3 is a partial exploded view of the modular enclosure of FIG. 1A.

Referring now to the figures, a modular electronics enclosure is shown in FIGS. 1-19 and designated broadly therein at 20. Referring to FIGS. 1A, 1B and 2, the enclosure 20 is generally a rectangular box, and comprises a rear wall 22, two side wall panels 24, two door panels 26, two floor panels 28a, 28b (see FIGS. 3 and 9), two ceiling panels 30a, 30b, and four L-shaped supports 32a, 32b, 32c, 32d (see FIGS. 12A 12B). These foundational components are fastened together to form the enclosure 20; they are discussed in greater detail below.

Figure 4A:
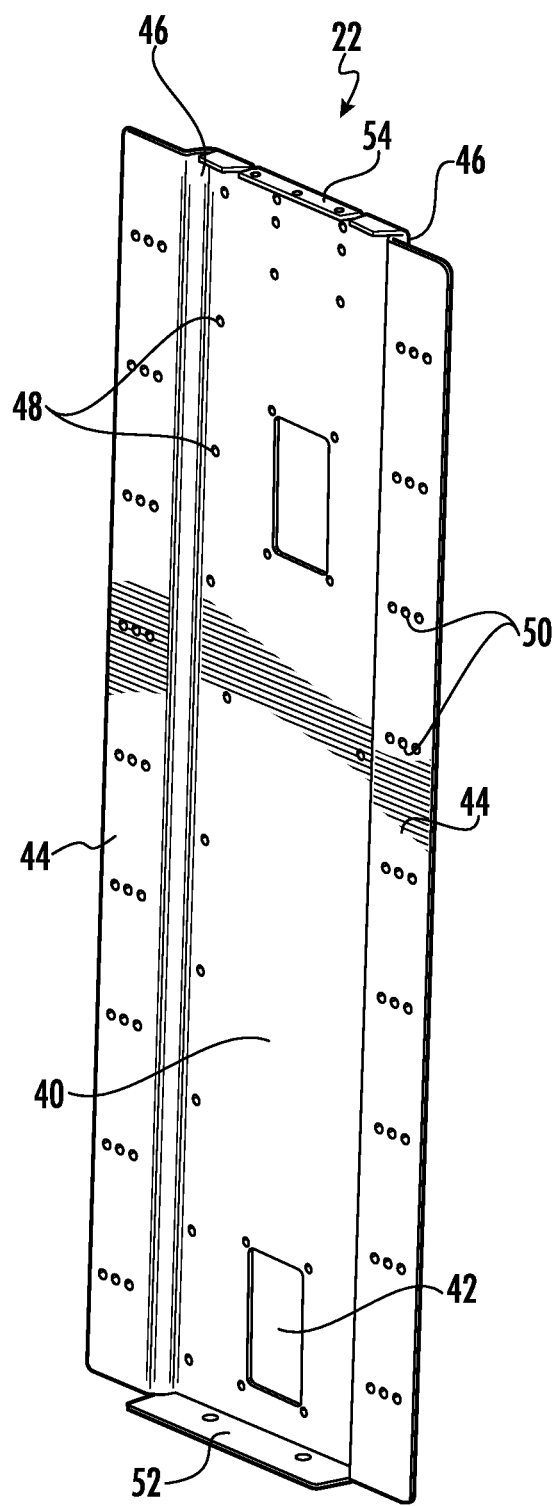
FIGS. 4A and 4B are front and rear perspective views of the back panel of the modular enclosure of FIG. 1A.
Figure 4B:
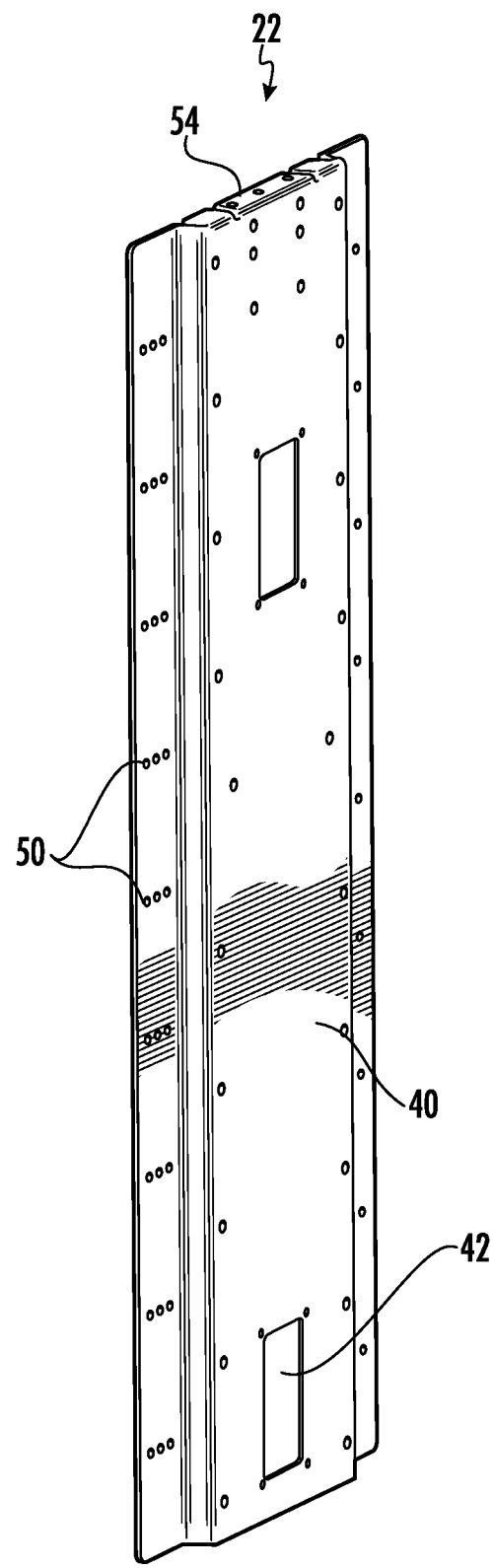

The rear wall 22 is shown in FIGS. 4A and 4B. The rear wall 22 includes a main section 40 with two windows 42. Wings 44 are attached to the side edges of the main section 40 via offset sections 46. Mounting holes 48 are positioned around the perimeter of the main section 40. A plurality of rows of mounting holes 50 are present in the wings 44. A lower attachment flange 52 extends forwardly from the lower edge of the main section 40, and upper flanges 54 extend forwardly from the upper edge of the main section 40.

Each of the side wall panels 24 (one of which is shown in FIGS. 5A and 5B) includes a main section 60 that is divided into four different perforated areas 62 to provide ventilation. Mounting holes 63 are located near the front edge of the main section 60. A small tab 64 extends inwardly from front upper and lower portions. Upper and lower perforated strips 65 are present adjacent the upper and lower edges. An inwardly-extending flange 66 with a perforated strip 67 extends from the rear edge of the main section 60. A mounting flange 68 with mounting holes 68a extends rearwardly from the inner edge of the flange 66.

In the illustrated embodiment, the side wall panels 24 are identical to each other. As such, a left-hand side wall panel 24 can be employed as a right-hand side wall panel 24 simply by rotating the side wall panel 24 upside-down (rotation of 180 degrees about a horizontal axis within the plane of the main section 60). Accordingly, the same part can be used for both of the side wall panels 24, thereby reducing the number of different parts that are manufactured. (As used herein, "identical" is intended to mean that the components are substantially identical in outer shape and profile, and may include components that differ in minor ways (e.g., color or other differences in cosmetic appearance, the presence or absence of one or more holes, tabs, etc.).

Figure 6A:
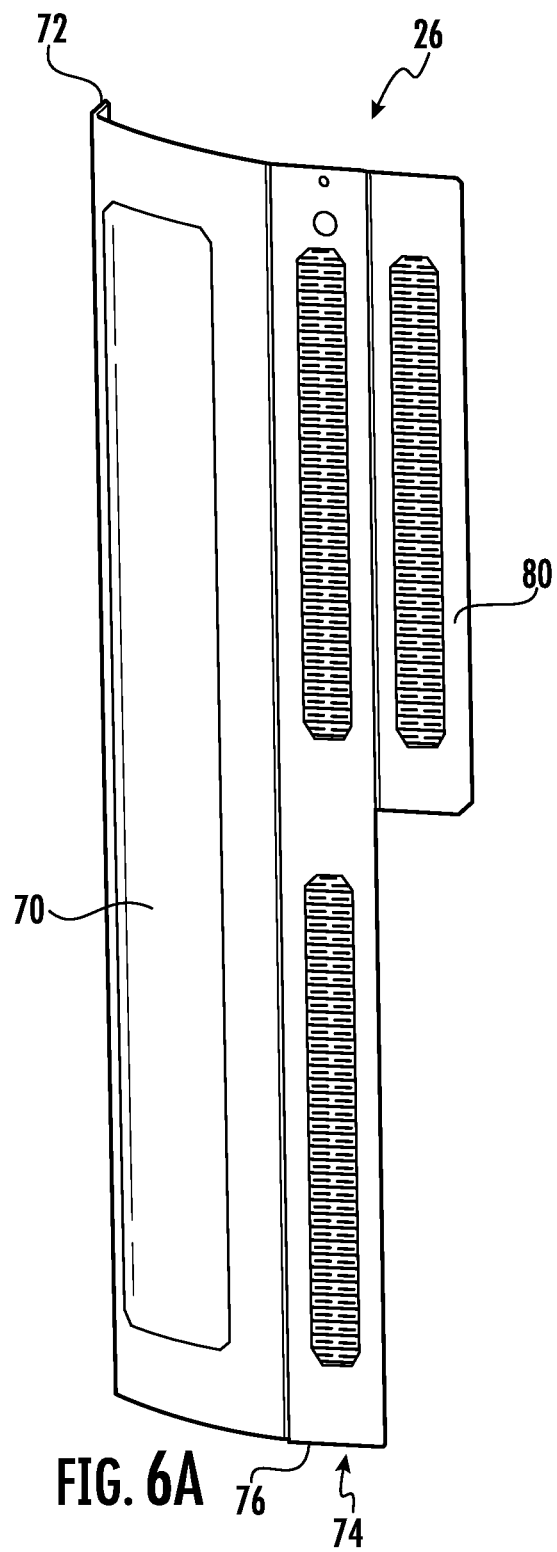
FIGS. 6A and 6B are front perspective views of the front door panels of the modular enclosure of FIG. 1A.
Figure 6B:
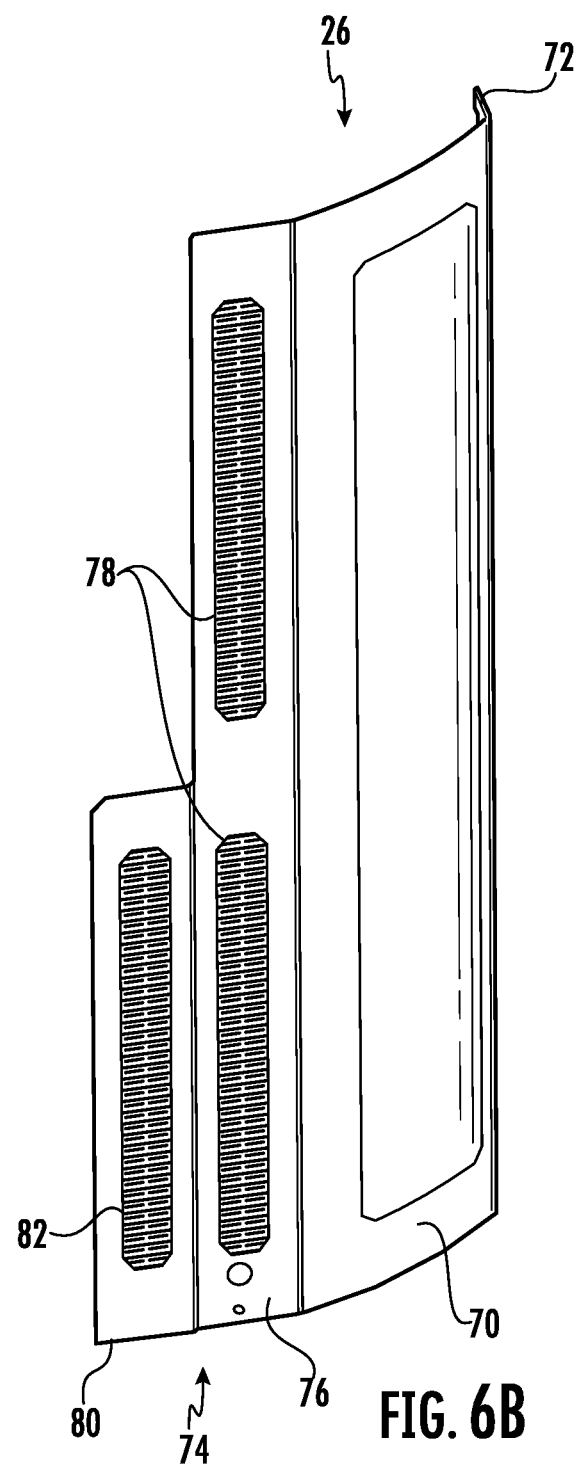
Figure 7:
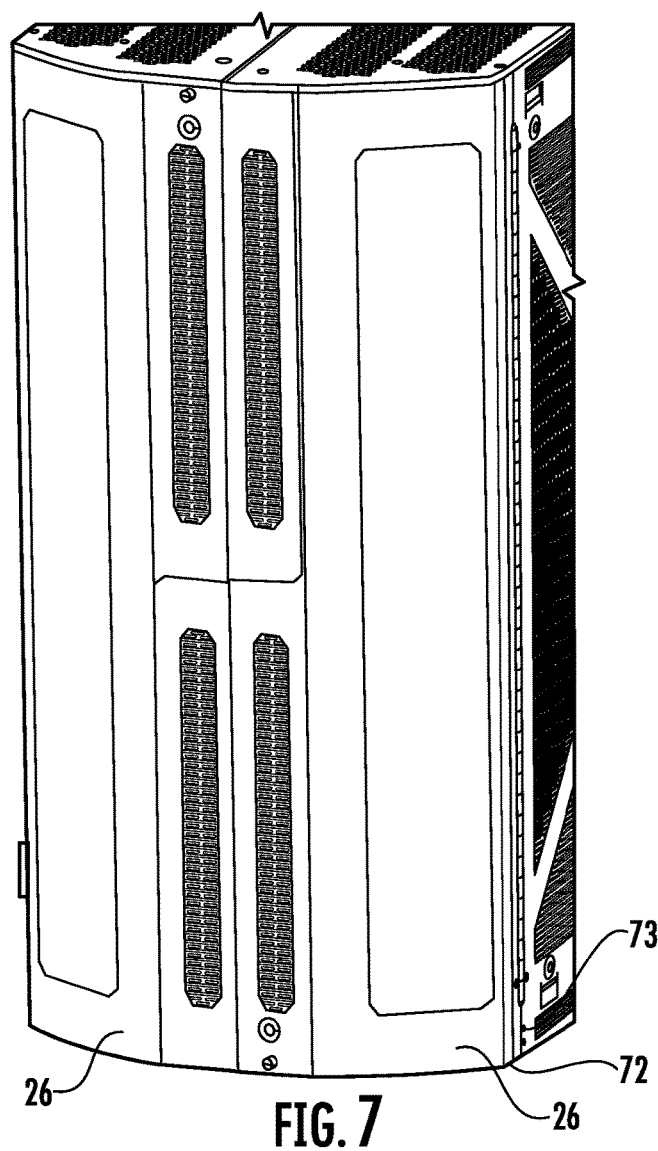
FIG. 7 is a front perspective view of the modular enclosure of FIG. 1A with the doors closed.
Figure 8:
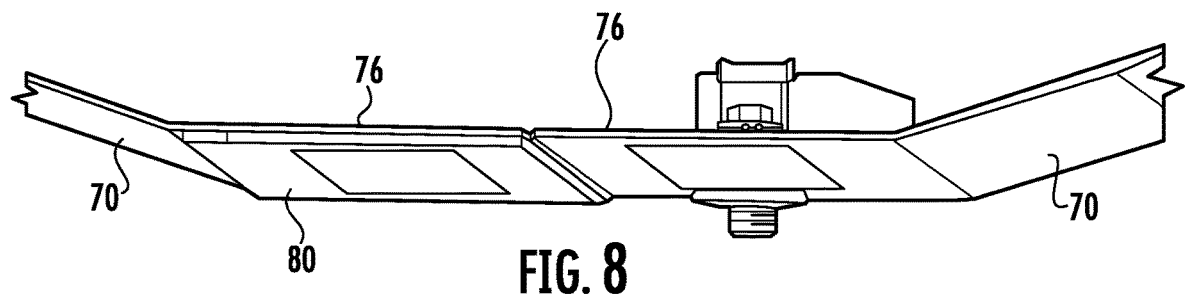
FIG. 8 is an enlarged partial top perspective section view of the door panels of the modular enclosure of FIG. 1A.

Referring now to FIGS. 6A and 6B, each of the door panels 26 includes a curved main portion 70, a rear flange 72, and an L-shaped front section 74. Mounting holes 73 are present in the rear flange 72 (FIG. 7). The front section 74 includes a full-length segment 76 with perforated sections 78, and further includes a half-length segment 80 with a perforated section 82. The half-length section 80 extends half the length of the full-length segment 76. As can be seen in FIG. 8, the half-length segment 80 is slightly forwardly offset from the full-length segment 76; the offset being equal to approximately the thickness of the full-length segment 76.

As can be seen in FIGS. 6A and 6B, two identical door panels 26 can be employed in the enclosure 20, with one of the door panels 26 being oriented upside down relative to the other door panel 26. The forward offset of the half-length segment 80 enables the door panels 26 to close without interference, as the half-length segment 80 can overlie a portion of the full-length segment 76.

Figure 9:
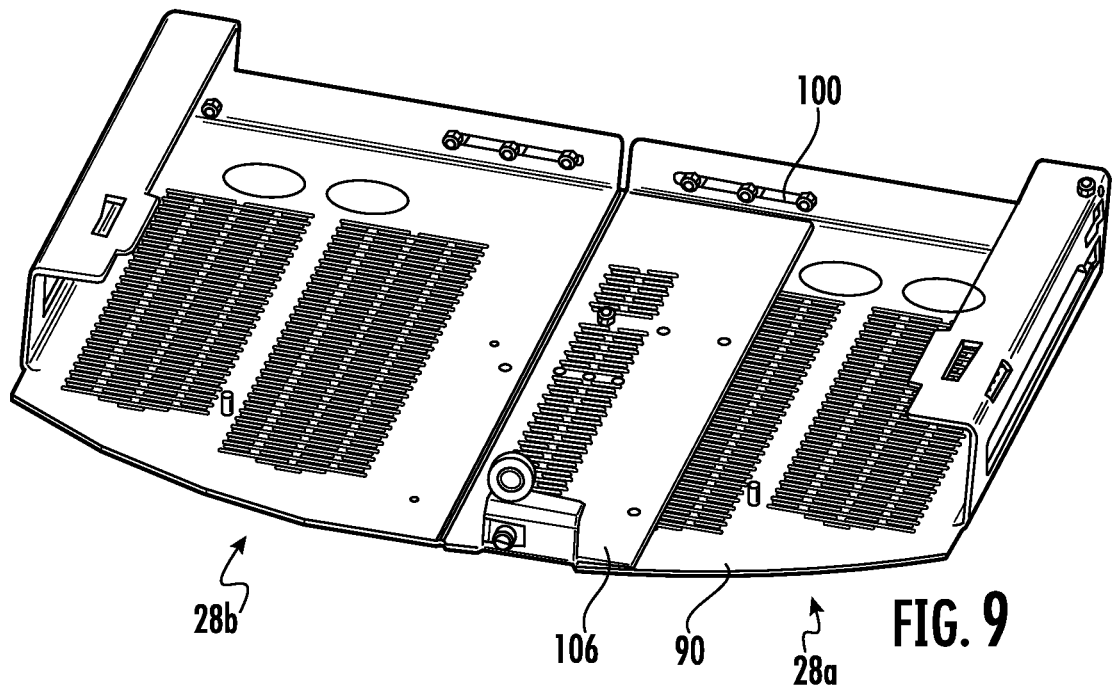
FIG. 9 is a front top perspective view of the floor panels of the modular enclosure of FIG. 1A shown in an assembled condition.
Figure 10A:
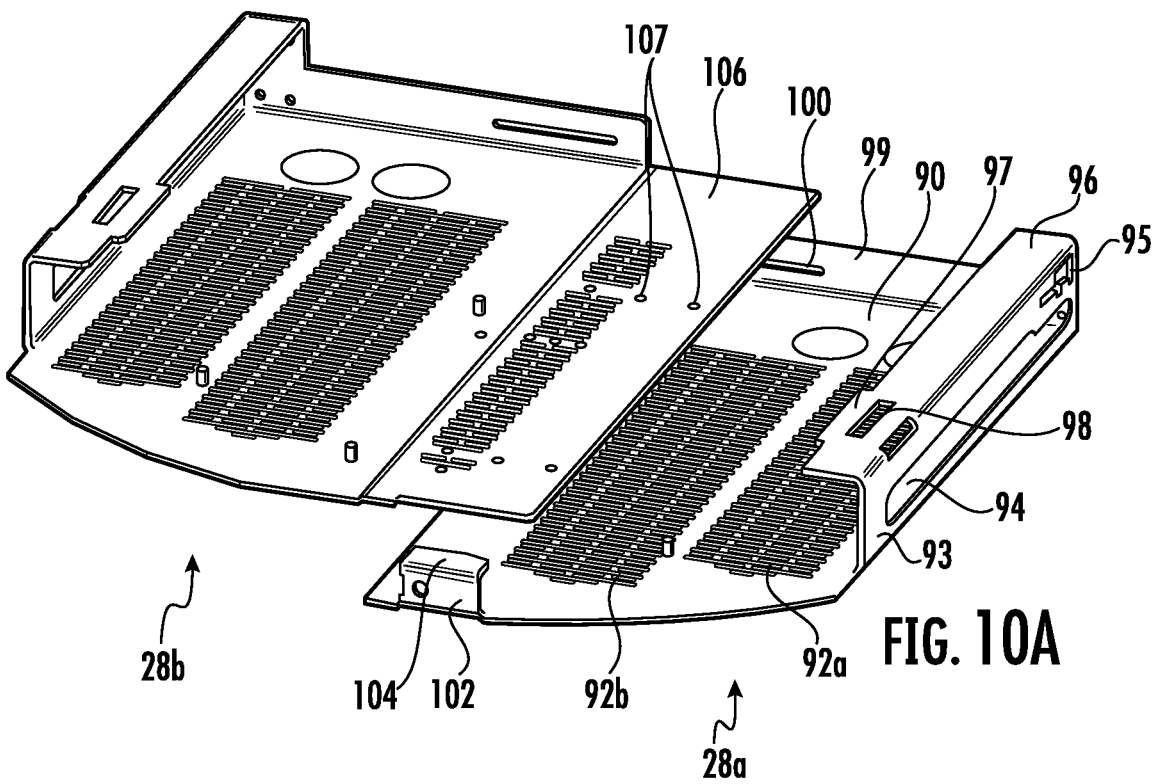
FIG. 10A is an exploded top perspective view of the floor panels of FIG. 9.
Figure 10B:
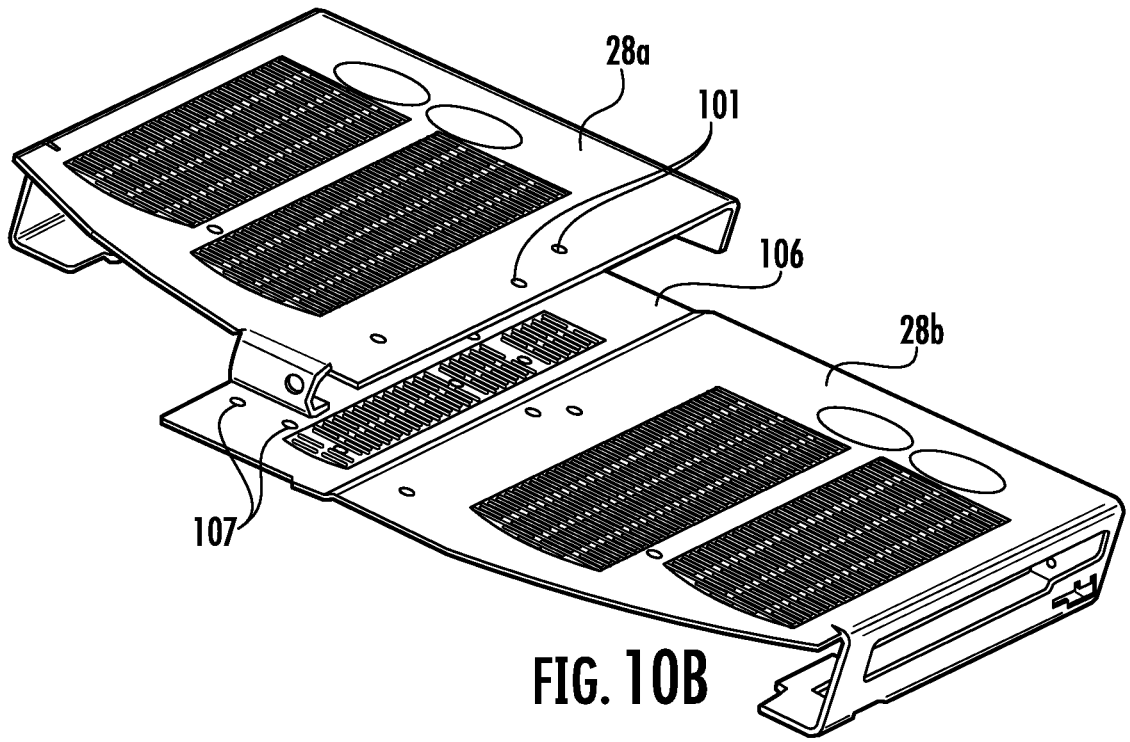
FIG. 10B is an exploded bottom perspective view of the floor panels of FIG. 9.

Referring now to FIGS. 9, 10A and 10B, the floor panels 28a, 28b are near mirror images of each other, such that the description of the floor panel 28a below is equally applicable to the floor panel 28b except as noted below. The floor panel 28a includes a main section 90 with perforated sections 92a, 92b. A side wall 93 extends upwardly from the side edge of the main section 90. A large slot 94 is present in the side wall 93, as is a smaller slot 95. A flange 96 extends inwardly from the upper edge of the side wall 93. A tab 97 extends inwardly from the flange 96, and a slot 98 is present outwardly of the tab 97. A rear wall 99 extends upwardly from the rear edge of the main section 90 and has a slot 100 on its inward portion. A front flange 102 extends upwardly from the front edge of the main section 90, and a tab 104 extends rearwardly from the front flange 102. Mounting holes 101 are present near the inward edge of the main section 90 (see FIG. 10B).

As noted above, the floor panel 28b is a mirror image of the floor panel 28a with the exceptions that (a) the floor panel 28b has no front flange 102 and tab 104, and (b) the floor panel 28b includes an overlay panel 106 that extends from the inward edge of the main section 90 and is slightly vertically offset (upwardly) from the main section 90. The overlay panel 106 includes multiple rows of mounting holes 107.

The floor panels 28a, 28b are positioned so that the overlay panel 106 of the floor panel 28b overlies the inward portion of the main section 90 of the floor panel 28a (see FIG. 9). Together the floor panels 28a, 28b form the floor of the enclosure 20. The floor panels 28a, 28b can be secured together with fasteners (e.g., screws or bolts) inserted through the mounting holes 101 and the mounting holes 107.

Figure 11:
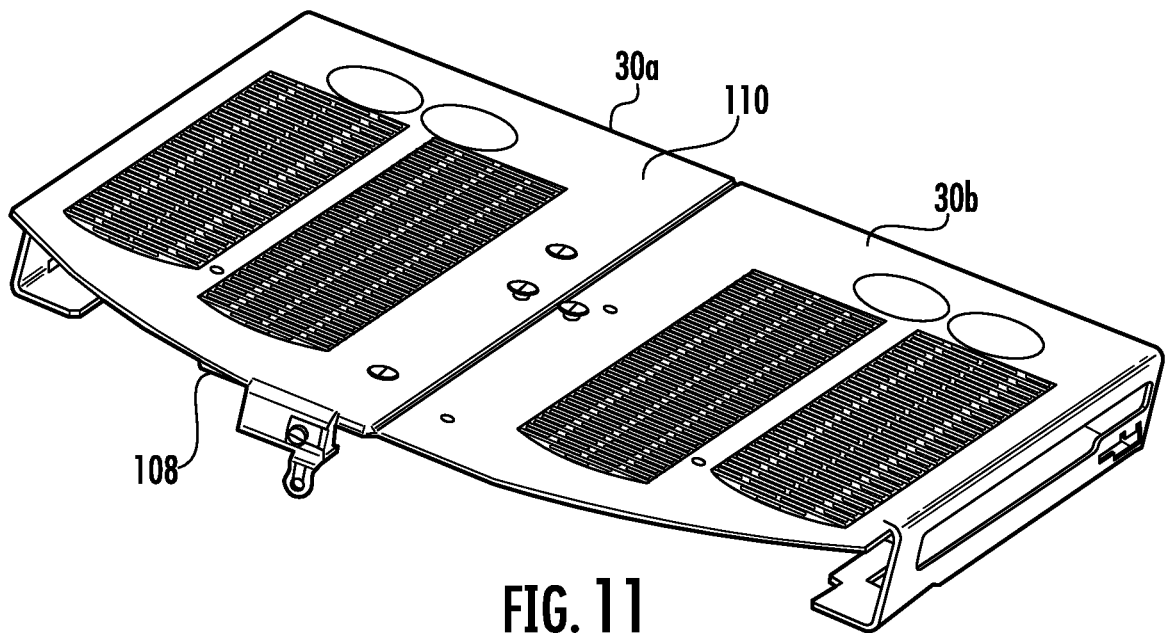
FIG. 11 is a front top perspective view of the ceiling panels of the modular enclosure of FIG. 1A shown in an assembled condition.

Referring now to FIG. 11, the ceiling panels 30a, 30b are identical to the floor panels 28a, 28b, but are inverted 180 degrees, such that the ceiling panel 30a is on the opposite side of the enclosure from the floor panel 28a, the ceiling panel 30b is on the opposite side of the enclosure from the floor panel 28b, and the overlay panel 108 of the ceiling panel 30b underlies the inward portion of the main section 110 of the ceiling panel 30a.

Figure 12A:
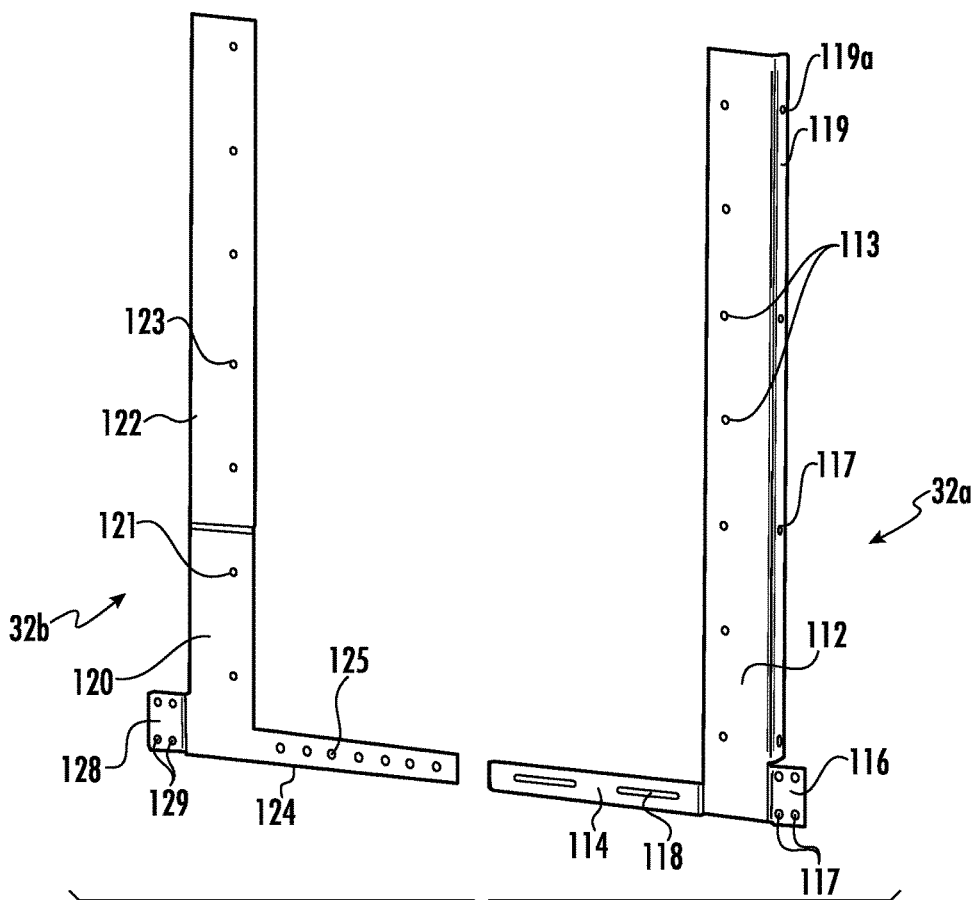
FIG. 12A is a front exploded perspective view of the two lower L-shaped supports of the modular enclosure of FIG. 1A.
Figure 13A:
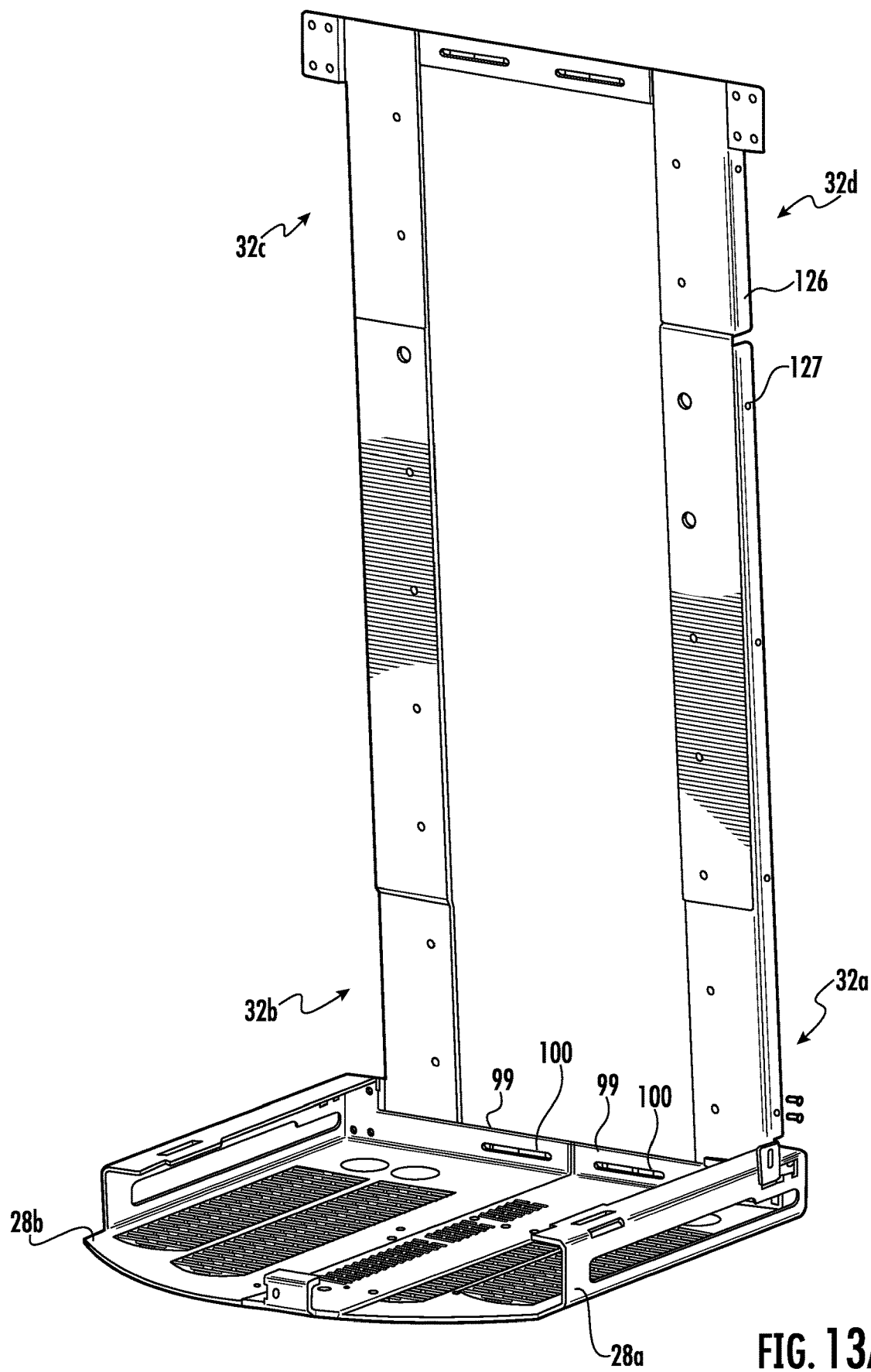
FIG. 13A is a front perspective view of the frame formed by the L-shaped supports of FIGS. 12A and 12B attached to the floor panels of FIG. 9.
Figure 13B:
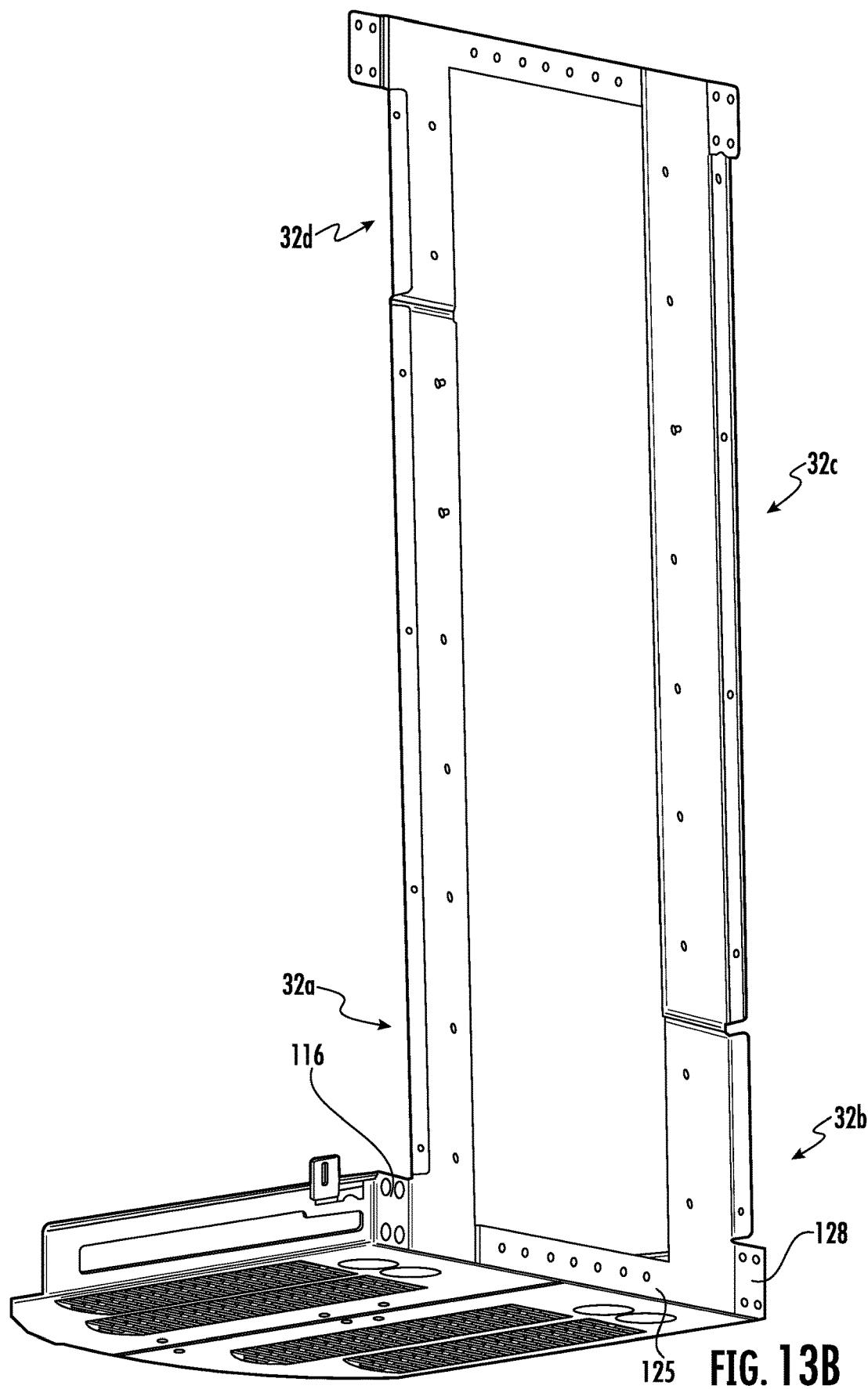
FIG. 13B is a rear perspective view of the frame and floor panels of FIG. 13B.

Referring now to FIGS. 12A, 13A and 13B, the L-shaped supports 32a, 32c are identical, but are oriented in inverted fashion relative to each other. Each of the L-shaped supports 32a, 32c includes a vertical panel 112 with mounting holes 113, a horizontal finger 114 with slots 118 that extends inwardly from the vertical panel 112, and a flange 119 with mounting holes 119a that extends rearwardly from the lateral edge of the vertical panel 112. A tab 116 with mounting holes 117 extends laterally from the lower end of the vertical panel 112. The horizontal finger 114 is forwardly offset slightly from the vertical panel 112.

Figure 12B:
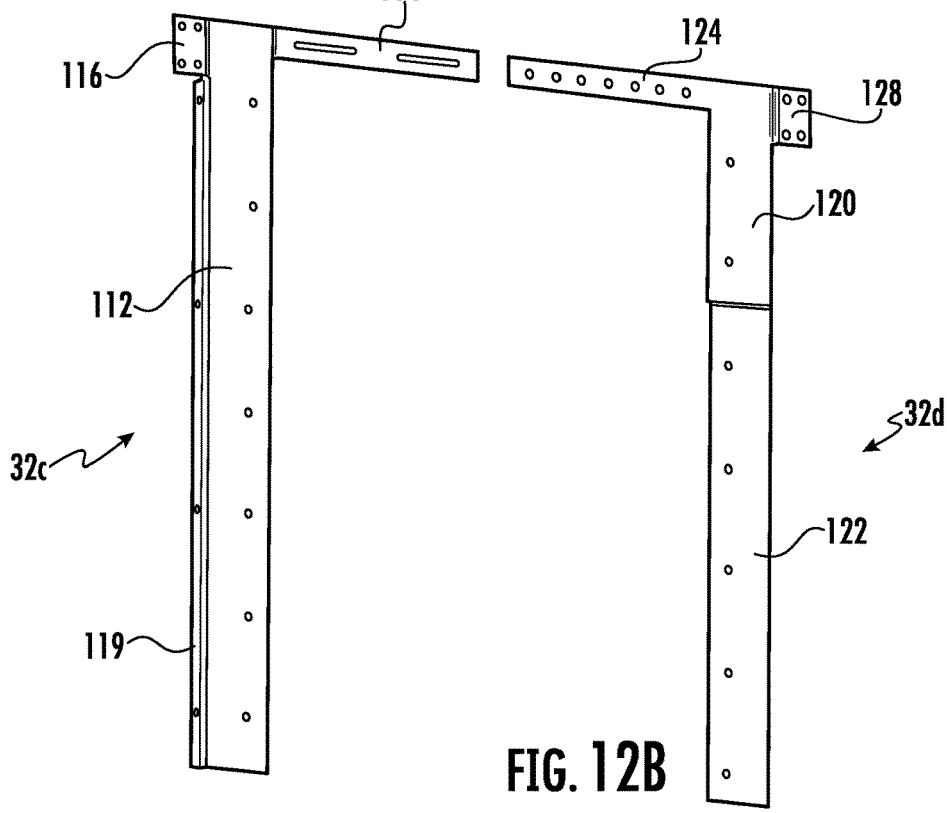
FIG. 12B is a front exploded perspective view of the two upper L-shaped supports of the modular enclosure of FIG. 1A.

Referring now to FIGS. 12B, 13A and 13B, the L-shaped supports 32b, 32d are identical, but are oriented in inverted fashion relative to each other. Each of the L-shaped supports 32b, 32d includes a vertical main panel 120 with mounting holes 121, an overlay panel 122 with mounting holes 123 that extends vertically and is forwardly offset from the main panel 120, a horizontal finger 124 with mounting holes 125 that extends inwardly from the main panel 120, a rearwardly-extending flange 126 with mounting holes 127 (see FIG. 13A) that merges with the lateral edge of the main panel 120, and a tab 128 with mounting holes 129 that extends laterally from the edge of the main panel 120.

As can be seen in FIGS. 13A and 13B, the L-shaped supports 32a, 32b, 32c, 32d form a rectangular frame. Specially, the finger 114 of the support 32a overlies the finger 124 of the support 32b, and the finger 114 of the support 32c overlies the finger 124 of the support 32d. The overlay panel 122 of the support 32b overlies the vertical panel 112 of the support 32c, and the overlay panel of the support 32d overlies the main panel of the support 32a. The frame is secured together by fasteners (e.g., screws or bolts) inserted through the mounting holes and/or slots of the overlying surfaces.

The assembly of these various components is described below. Beginning with the floor panels 28a, 28b, these are arranged so that the overlay panel 106 of the floor panel 28b overlies the inward portion of the main section 90 of the floor panel 28a (see FIG. 9). Fasteners are inserted into mounting holes 101 and mounting holes 107 to secure the floor panels 28a, 28b together at a desired width. The L-shaped supports 32a, 32b are attached to the rear walls 99 of the floor panels 28a, 28b with screws inserted into the slots 100; the overlay panel 122 of the L-shaped support 32b overlies the finger 114 of the L-shaped support 32a. The tabs 116, 128 are attached to lateral portions of the rear walls 99 via screws inserted into mounting holes 117, 129 in the tabs 116, 128 (FIG. 13B).

Referring still to FIGS. 13A and 13B, the L-shaped supports 32c, 32d can then be attached to the L-shaped supports 32a, 32b, with the overlay panel 122 of the support 32d overlying the vertical panel 112 of the support 32c, the overlay panel 122 of the support 32b overlying the vertical panel 112 of the support 32a, and the finger 114 of the support 32c overlying the finger 124 of the support 32d. The L-shaped supports 32a-d are attached to each other via screws or bolts inserted through the mounting holes 113, 121.

The rear wall 22 can then be attached to the frame formed by the supports 32a, 32b, 32c, 32d. The wings 44 of the rear wall are attached to the rear surfaces of the supports 32a-d via screws inserted through the mounting holes 50 and the mounting holes 119a, 127 (see FIG. 2). The lower attachment flange 52 underlies the floor panels 28a, 28b.

Figure 13C:
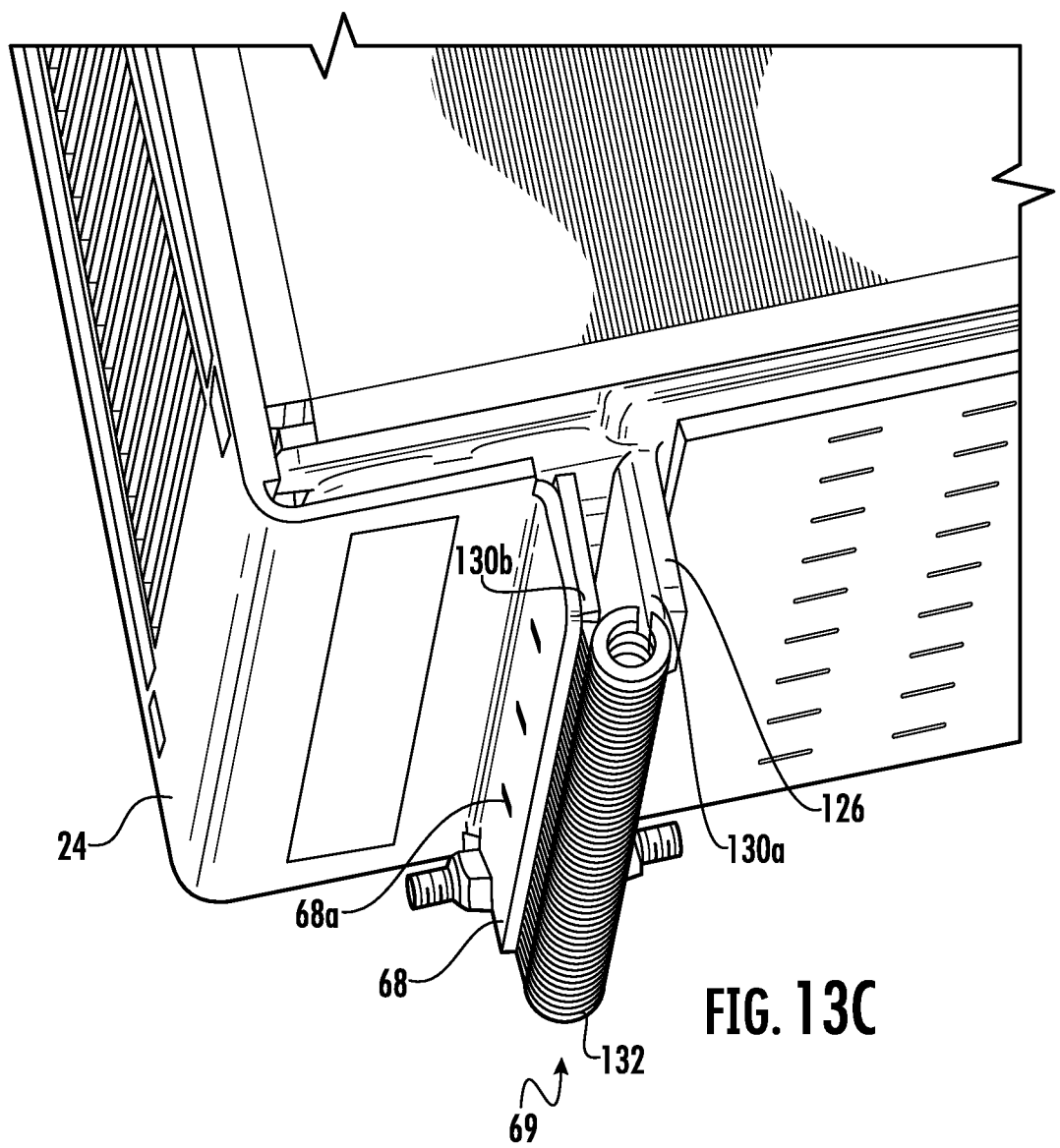
FIG. 13C is an enlarged partial top perspective view of one of the hinges attaching the side wall panels to the L-shaped supports of the modular enclosure of FIG. 1A.
Figure 14A:
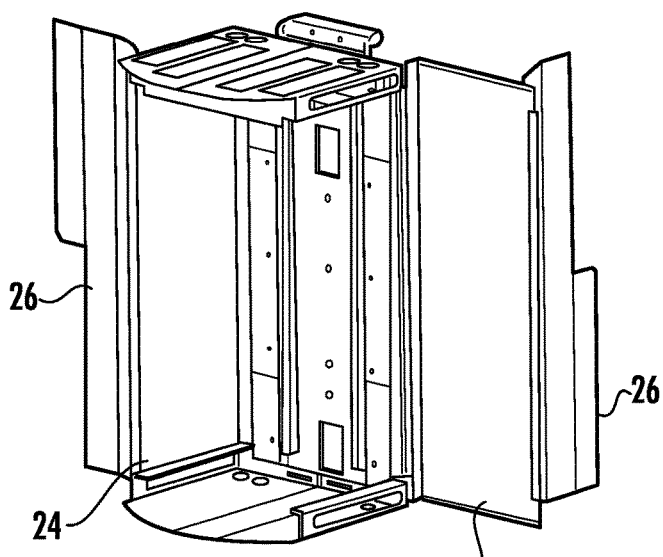
FIGS. 14A and 14B are perspective views of the enclosure of FIG. 1 shown with the side wall panels in an open position.
Figure 14B:
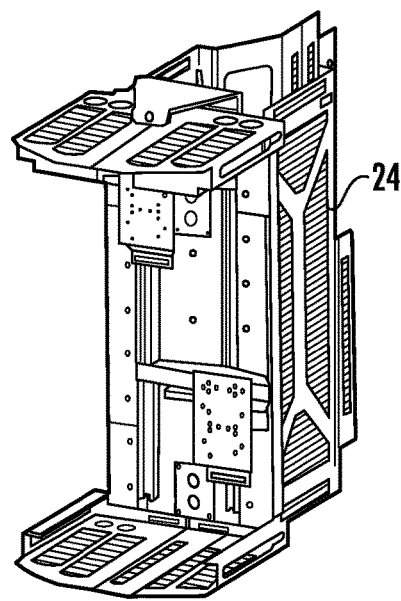
Figure 15A:
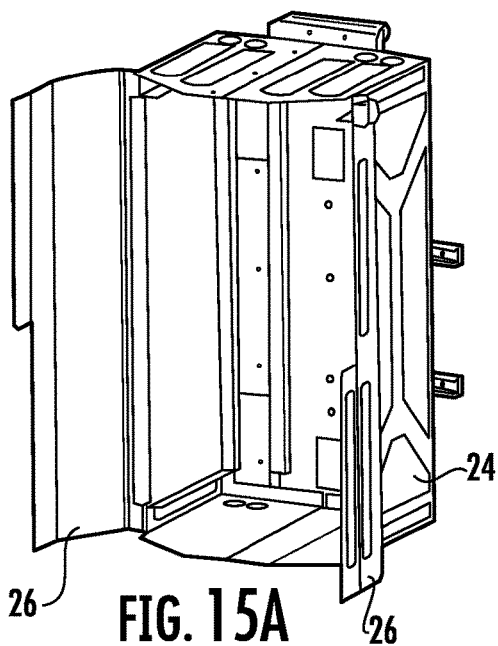
FIGS. 15A and 15B are perspective views of the enclosure of FIG. 1 shown with the door panels in an open position.
Figure 15B:
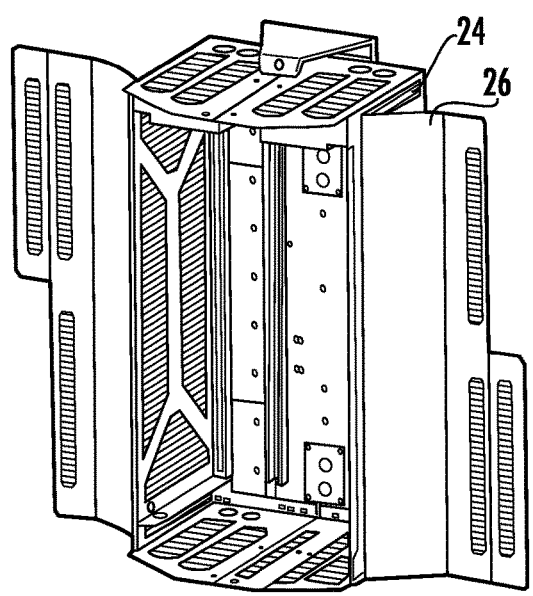

As can be seen in FIGS. 1B and 13C, the side wall panels 24 are attached to the L-shaped supports 32a-32d via hinges 69. Each hinge 69 has two vertical hinge plates 130a, 130b with interdigitating knuckles 132. The hinge plate 130a is attached to the flanges 119, 126 of the L-shaped supports 32a, 32d on one side of the enclosure 20 and to the flanges 119, 126 of the L-shaped supports 32b, 32c on the opposite side of the enclosure. 20 The mounting flanges 68 of side wall panels 24 are then attached to the hinge plates 130b of each hinge 69 via the mounting holes 68a. The hinges 69 enable the side wall panels 24 to pivot relative to the rear wall 22 about the vertical axes defined by the hinges 69.

Figure 16:
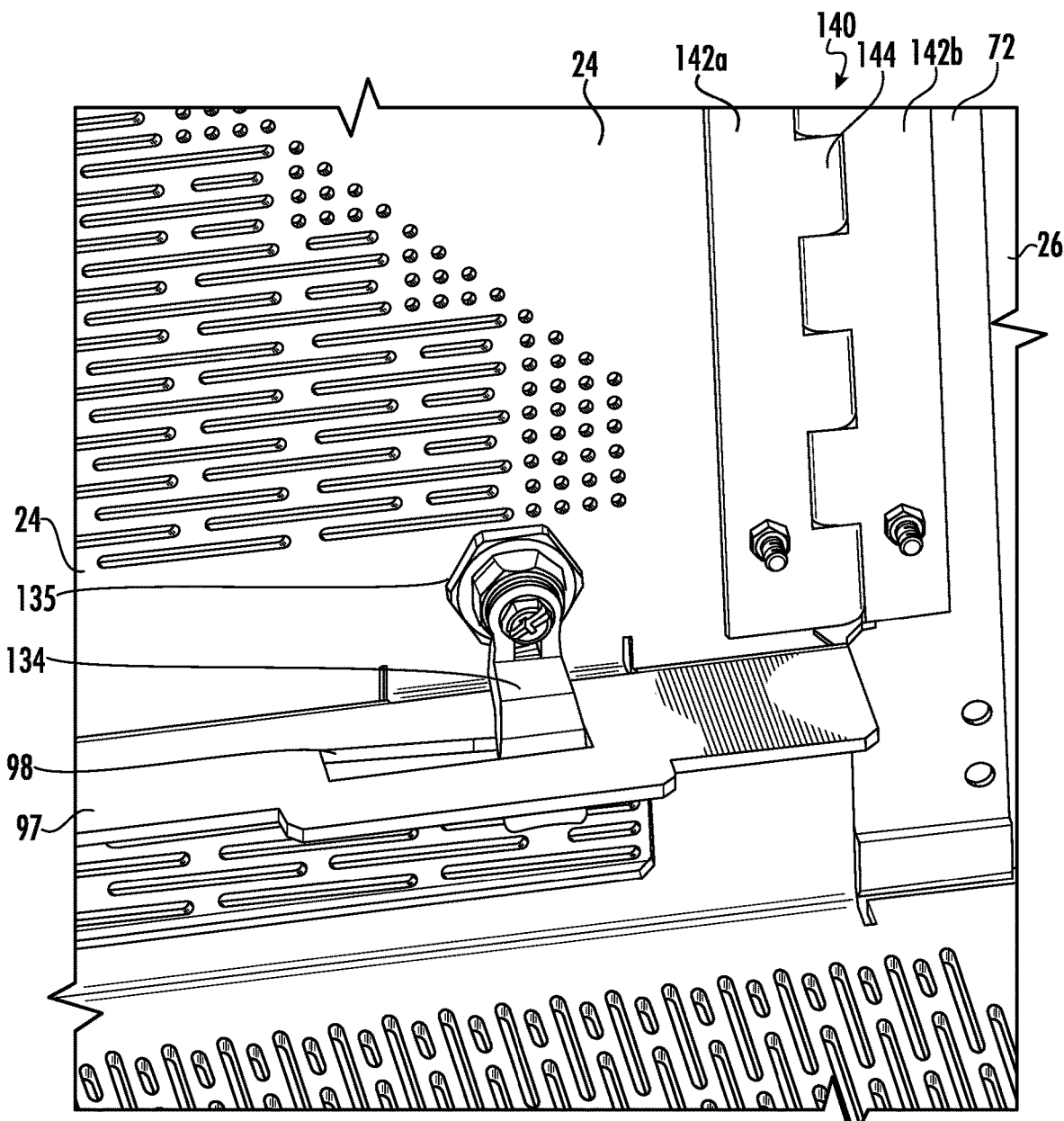
FIG. 16 is an internal partial perspective view of a locking member for the side wall panel of the modular enclosure of FIG. 1A.
Figure 17:
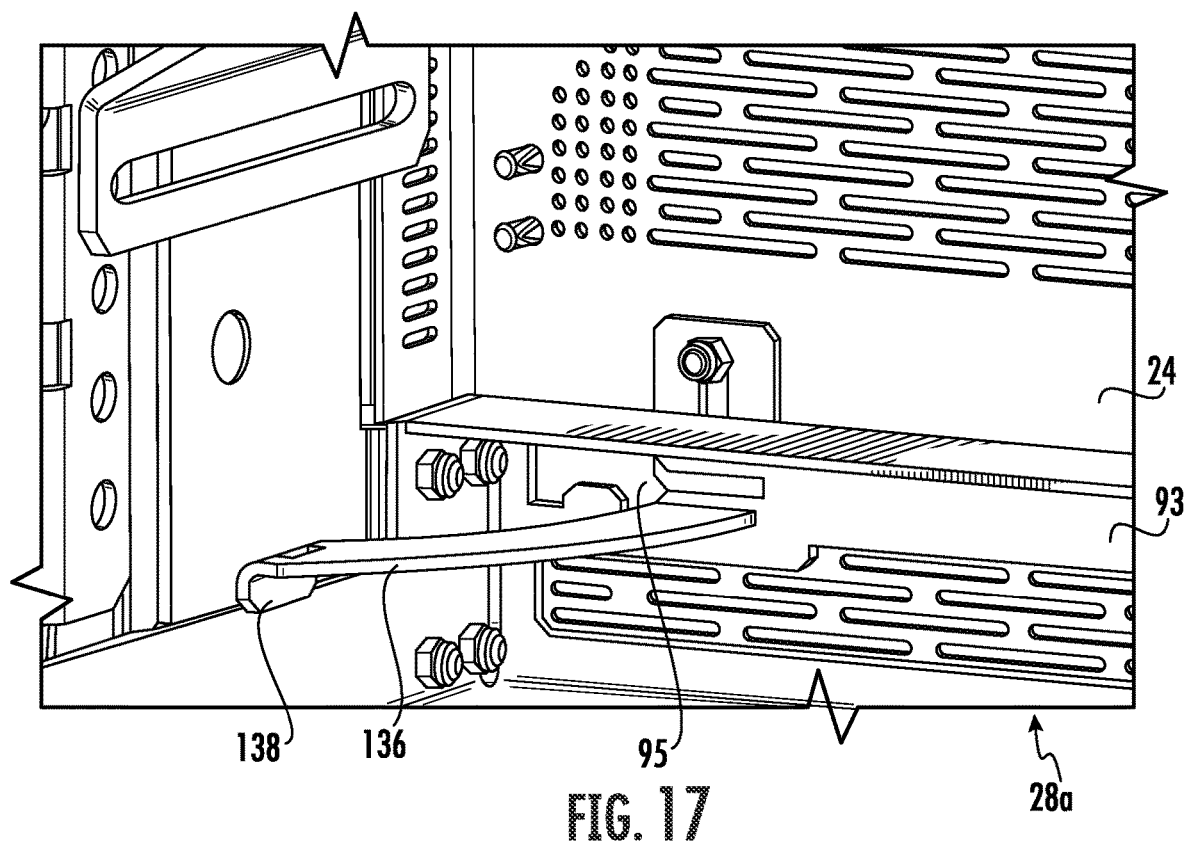
FIG. 17 is an internal partial perspective view of a brace for the side wall panel of the modular enclosure of FIG. 1A.
Figure 18:
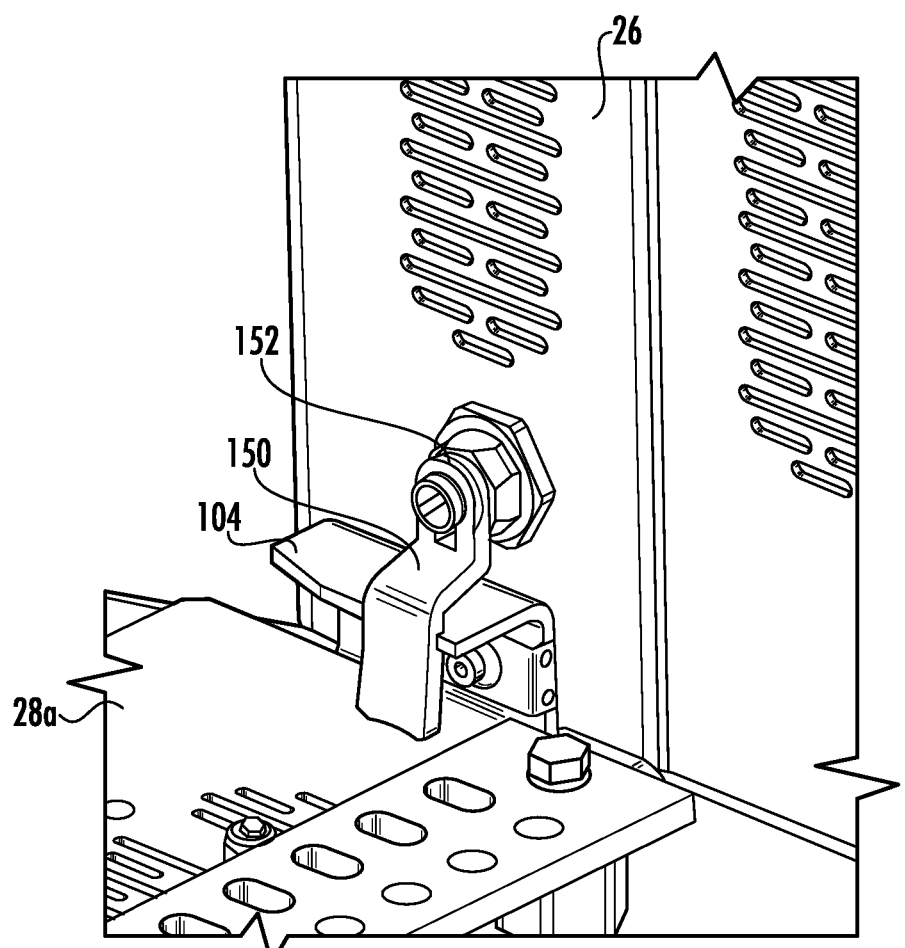
FIG. 18 is an internal partial perspective view of a locking member for the door panel of the modular enclosure of FIG. 1A.

Referring to FIG. 16, it can be seen that the side wall panels 24 can be locked into place via a locking member 134 that is pivotally attached to the inner surface of the main section 40. A quarter-turn nut 135 is accessible from the outer surface of the main section 40. The locking member 134 extends into the slot 98 of the flange 97 of the floor panel 28a. Pivoting the locking member 134 via the quarter-turn nut 135 to a downwardly-extending position within the slot 98 prevents the side wall panel 24 from pivoting relative to the rear wall 22. Pivoting the locking member 134 to a rearwardly-extending horizontal position removes the locking member 134 from the slot 98, thereby enabling the side wall panel 24 to pivot relative to the rear wall 22 about the hinge 69.

Also, a curved brace 136 (FIG. 17) is attached to the inner surface of the side wall panel 24 and extends through the smaller slot 95 in the side wall 93 of the floor panel 28a. The brace 136 has a bent tip 138 that is positioned near the rear wall 99 of the floor panel 28a. When the side wall panel 24 pivots about the hinge 69, the brace 136 is free to move within the smaller slot 95; however, when the bent tip 138 reaches the side wall 93 of the floor panel 28a during such pivotal movement, the tip 138 engages the side wall 93 and prevents further pivotal movement. Thus, the brace 136 serves as a stop for pivoting of the side wall panel 24.

When one or both of the side wall panels 24 is pivoted to an open position (see FIGS. 14A and 14B), a technician may have access to the rear area of the interior of the enclosure 20. In some circumstances, it may be desirable to open only one side wall panel 24, which can be achieved with the illustrated configuration.

The door panels 26 are attached to the side wall panels 24 via hinges 140 (see FIG. 16). Each hinge 140 includes hinge plates 142a, 142b with interdigitating knuckles 144. The hinge plate 142a is fixed to the inner surface of the front edge of the main section 60 of the side wall panel 24 via screws/bolts inserted into mounting holes 63. The hinge plate 142b is fixed to the inner surface of the rear flange 72 of the door panel 26 via screws/bolts inserted into mounting holes 73. As a result, the door panels 26 are able to pivot relative to the side wall panels 24 about the vertical axes defined by the hinges 140 (see FIGS. 15A and 15B). This position can enable the interior of the enclosure 10 to be accessed, and particularly the front portion of the interior, without opening the remainder of the enclosure 10.

The door panels 26 are held in place by a locking member 150 (FIG. 18) that extends downwardly and rearwardly from a pivot (defined by a quarter turn nut 152) with the door panel 26. The locking member 150 is configured and positioned to engage with and disengage from the tab 104 of the floor panel 28a to either permit or prevent pivoting of the door panel 26 relative to the side wall panel 24

The ceiling panels 30a, 30b are attached to the L-shaped supports 32c, 32d in much the same manner as the floor panels 28a, 28b. The ceiling panels 30a, 30b are arranged so that the overlay panel 108 of the ceiling panel 30b underlies the inward portion of the main section 110 of the ceiling panel 28a. The L-shaped supports 32c, 32d are attached to the rear walls 99 of the ceiling panels 30a, 30b with screws inserted into the slots 100. A locking member 155 similar to the locking member 134 is mounted to the side wall panel 24 and engages the slot in the flanged of the ceiling panel 30b.

Figure 19:
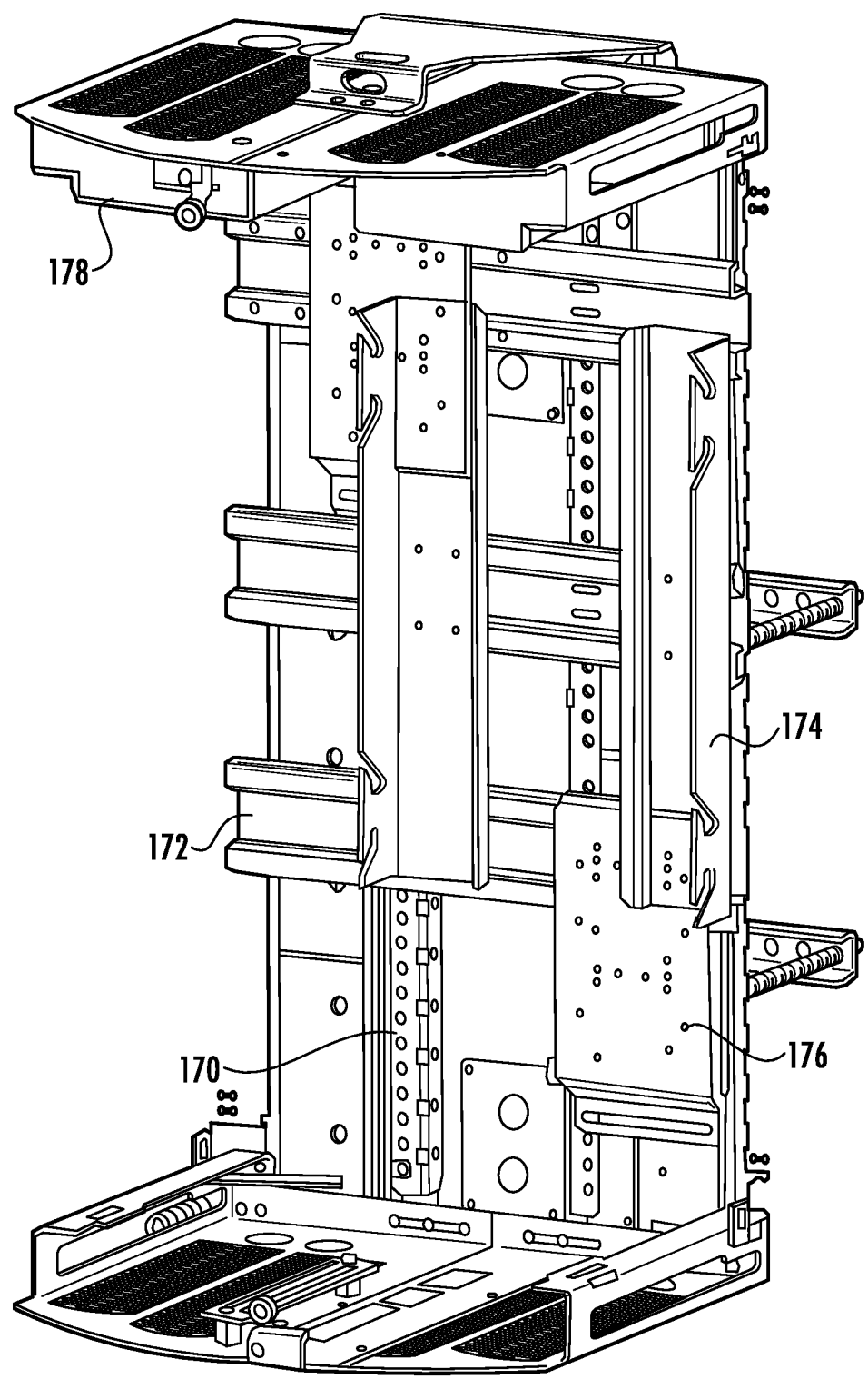
FIG. 19 is a front perspective view of components that can be employed to mount equipment in the modular enclosure of FIG. 1A.

The enclosure 10 as constructed in the manner described above can then serve as a protective casing for components mounted therein. As shown in FIG. 19, other structures may be mounted within the enclosure 10 to provide mounting locations. For example, Unistrut members 170 may be vertically mounted to the forward surface of the rear wall 22. Cross-members 172 may then be mounted to the Unistrut members 170 to provide mounting locations for equipment, such as an RRU, a power supply and the like. Other types of mounting components include brackets 174, panels 176, and covers 178. Other varieties of mounting devices may be employed.

In addition, components may be mounted on the outer surface of the enclosure to enable the enclosure to be mounted in different environments. For example, as shown in FIG. 1B, a framework 180 may be used to mount the enclosure to a mounting pole. The framework 180 includes a vertical mounting bracket 182 attached to the rear surface of the rear wall 22, tying brackets 184, 186 that are mounted above the vertical mounting bracket 182 to the vertical mounting bracket 182 and to the ceiling panels 30a, 30b, and clamps 188 with threaded rods 190, wherein one jaw of each clamp 188 is mounted to the vertical bracket 182, and the other jaw of each clamp 188 is attached via the threaded rods 190; the jaws of each clamp can be threaded together to clamp a pole therebetween.

Figure 22:
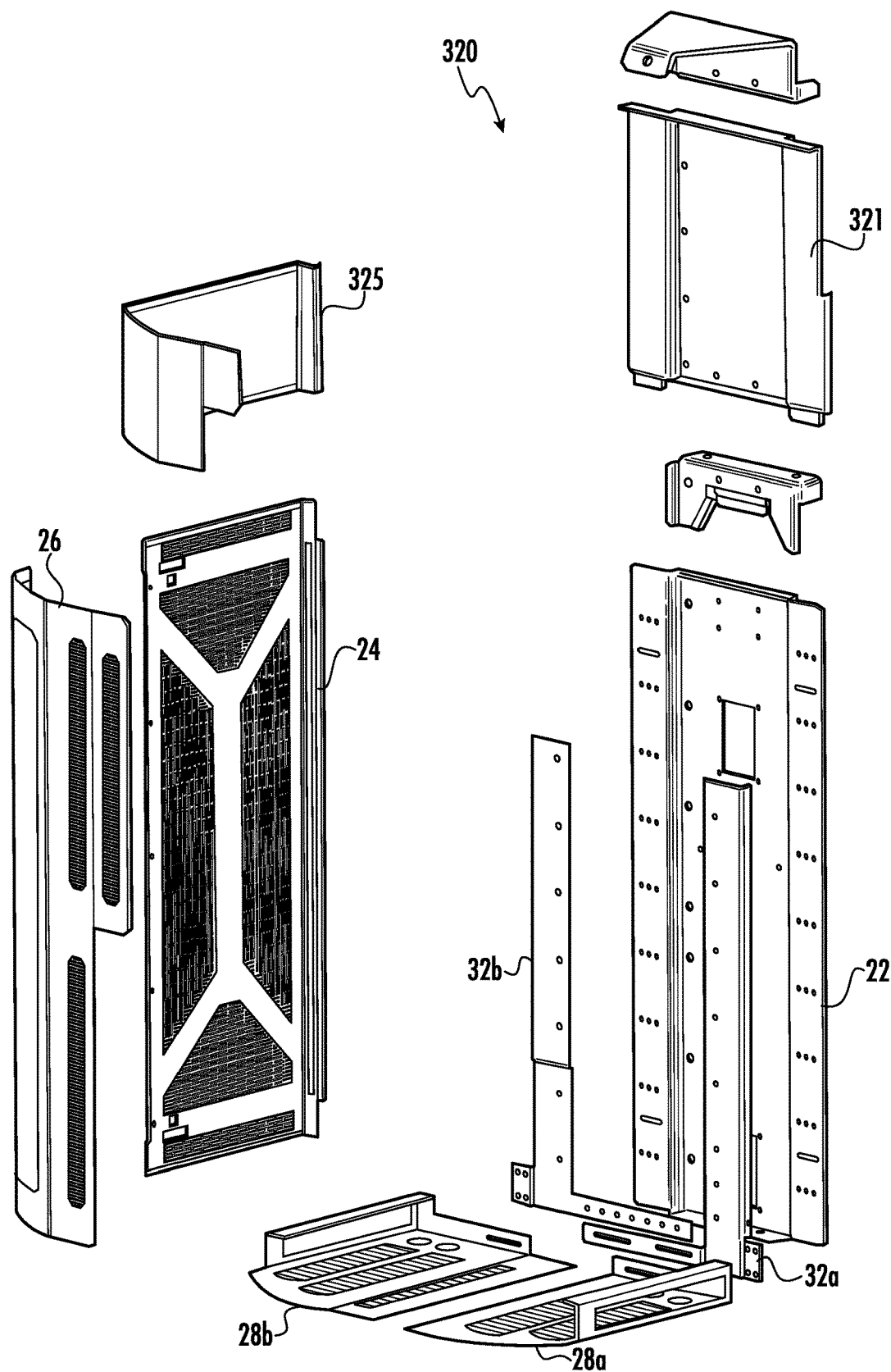
FIG. 22 is an exploded perspective view of the modular enclosure of FIG. 21 showing some additional components employed t provide a taller enclosure.

Referring now to FIGS. 20-22, it can be seen that components of the enclosure 20 may be assembled somewhat differently to provide an enclosure of a different configuration. FIG. 20 illustrates an enclosure 220 that is the same height as the enclosure 20, but is wider (i.e., there is greater distance between the side wall panels 24). In the enclosure 220, the floor panels 28a, 28b and the ceiling panels 30a, 30b are of the same configuration as the floor panels 28a, 28b and ceiling panels 30a, 30b discussed above in connection with the enclosure 20, but are arranged so that the overlay panels 106 of the floor panel 28b and the ceiling panel 30b overlay a much smaller portion of the main sections 90 of the floor panel 28a and ceiling panel 30a. Also, the framework formed by the L-shaped supports 32a-32d is arranged so that the vertical members are farther apart, with the fingers 124 of the L-shaped supports 32b, 32d overlying a much smaller portion of the fingers 114, and so that the wings 44 of the rear wall 22 overlie less of the L-shaped supports 32a-32d. In addition, the door panels 26 of the enclosure 220 are the same as those of the enclosure 20, but the half-length segments 80 overlie a smaller portion of the full-length segments 76 of the opposing door panel 26. Thus, a wider version of the enclosure 20 can be provided with the same components arranged differently.

Referring now to FIGS. 21 and 22, the same components that are used in the enclosures 20, 220 can be augmented with a few additional components to provide a taller version of the enclosure 20 that is designated broadly at 320. As can be seen in FIGS. 21 and 22, the enclosure 320 includes a rear wall enhancer 321 that is similar in profile to the rear wall 22 that can be fitted atop the rear wall 22. Also, side/front enhancers 325 (which have similar overlay panels to those of the door panels 26) are attached above and below the side wall panels 24 and door panels 26 and are arranged to mimic the profile of the side wall panels 24 and door panels 26 in the closed position. Thus, by including these few additional components, the height of the enclosure 320 can be greater than that of the enclosure 20.

It should also be noted that the taller enclosure 320 may be re-arranged as a wider version of the enclosure 320 by re-arranging the floor panels 28a, 28b, the ceiling panels 30a, 30b, and the L-shaped supports 32a-d in the manner described above in connection with the enclosure 220.

The invention being thus described, it will be apparent that the same may be varied in many ways. Such variations are not to be regarded as a departure from the spirit and scope of the invention, and all such modifications as would be obvious to one skilled in the art are to be included within the scope of the following claims.

What is claimed is:

1. An electronics enclosure, comprising;
a pair of floor panels that engage to form a floor;
a pair of ceiling panels that engage to form a ceiling;
a rear wall;
four L-shaped supports that are fixed together to form a rectangular framework, the framework being fixed to the rear wall, the floor panels, and the ceiling panels;
a pair of side wall panels attached to the framework; and
a pair of door panels attached to the side wall panels.

2. The enclosure defined in claim 1, wherein the floor panels are identical to the ceiling panels.

3. The enclosure defined in claim 1, wherein a first of the floor panels includes a first main section and an offset overlay panel, and a second of the floor panels includes a second main section, and wherein the overlay panel overlies the second main section.

4. The enclosure defined in claim 1, wherein the side wall panels are identical.

5. The enclosure defined in claim 1, wherein the door panels are identical.

6. The enclosure defined in claim 1, wherein first and second of the L-shaped supports are identical, and third and fourth of the L-shaped supports are identical.

7. The enclosure defined in claim 6, wherein each of the third and fourth L-shaped supports includes an offset overlay panel that overlies a portion of, respectively, the first and second L-shaped supports.

8. The enclosure defined in claim 1, wherein each of the door panels is attached to a respective side wall panel via a hinge having a vertical pivot axis.

9. The enclosure defined in claim 1, wherein each of the side wall panels is attached to the framework via a hinge having a vertical pivot axis.

10. The enclosure defined in claim 8, wherein each hinge is a first hinge, and wherein each of the side wall panels is attached to the framework via a second hinge having a vertical pivot axis.

11. The enclosure defined in claim 1, wherein each of the door panels includes a front portion having a full-length section and a half-length section, and wherein the half-length section is offset from the full-length section.

12. The enclosure defined in claim 11, wherein the half-length section of a first of the door panels overlies a portion of the full-length section of a second of the door panels.

13. An electronics enclosure, comprising:
a pair of floor panels that engage to form a floor;
a pair of ceiling panels that engage to form a ceiling;
a rear wall;
first, second, third and fourth L-shaped supports that are fixed together to form a rectangular framework, the framework being fixed to the rear wall, the floor panels, and the ceiling panels, the first and second L-shaped supports being identical, and the third and fourth L-shaped supports being identical;
a pair of identical side wall panels pivotally attached to the framework; and
a pair of identical door panels pivotally attached to the side wall panels.

14. The enclosure defined in claim 13, wherein the floor panels are identical to the ceiling panels.

15. The enclosure defined in claim 13, wherein a first of the floor panels includes a first main section and an offset overlay panel, and the second of the floor panels includes a second main section, and wherein the overlay panel overlies the second main section.

16. The enclosure defined in claim 13, wherein each of the third and fourth L-shaped supports includes an offset overlay panel that overlies a portion of, respectively, the first and second L-shaped supports.

17. The enclosure defined in claim 13, wherein each of the door panels includes a front portion having a full-length section and a half-length section, and wherein the half-length section is offset from the full-length section.

18. The enclosure defined in claim 17, wherein the half-length section of a first of the door panels overlies a portion of the full-length section of a second of the door panels.

19. An electronics enclosure, comprising:
a pair of floor panels that engage to form a floor;
a pair of ceiling panels that engage to form a ceiling;
a rear wall;
four L-shaped supports that are fixed together to form a rectangular framework, the framework being fixed to the rear wall, the floor panels, and the ceiling panels;
a pair of side wall panels attached to the framework; and
a pair of door panels attached to the side wall panels;
wherein a first of the floor panels includes a first main section and an offset overlay panel, and the second of the floor panels includes a second main section, and wherein the overlay panel overlies the second main section, such that the floor panels can accommodate enclosures of different widths.

20. The enclosure defined in claim 19, wherein the floor panels are identical to the ceiling panels.

* * * * *